US008432235B2

(12) United States Patent
Yoshioka et al.

(10) Patent No.: US 8,432,235 B2

(45) Date of Patent: Apr. 30, 2013

(54) COUPLER AND COMMUNICATION SYSTEM

(75) Inventors: Masahiro Yoshioka, Tokyo (JP); Hiroshi Ichiki, Kanagawa (JP)

(73) Assignee: Sony Corporation, Tokyo (JP)

( * ) Notice: Subject to any disclaimer, the term of this patent is extended or adjusted under 35 U.S.C. 154(b) by 349 days.

(21) Appl. No.: 12/858,740

(22) Filed: Aug. 18, 2010

(65) Prior Publication Data

US 2011/0043305 A1 Feb. 24, 2011

(30) Foreign Application Priority Data

Aug. 24, 2009 (JP) ................................ P2009-193251

(51) Int. Cl.
*H01P 5/00* (2006.01)
*H03H 7/00* (2006.01)

(52) U.S. Cl.
USPC .................... 333/24 R; 333/172; 343/700 MS

(58) Field of Classification Search ................ 333/24 R, 333/24 C, 172, 185; 343/700 MS, 797
See application file for complete search history.

(56) References Cited

U.S. PATENT DOCUMENTS 6,897,831 B2 * 5/2005 McKinzie et al. ............ 343/909

FOREIGN PATENT DOCUMENTS

JP 2006 186418 7/2006

* cited by examiner

*Primary Examiner* — Dean O Takaoka

(74) *Attorney, Agent, or Firm* — Frommer Lawrence & Haug LLP; William S. Frommer; Ellen Marcie Emas

(57) ABSTRACT

A coupler includes a first conductive pattern provided on a substrate having insulating property, a second conductive pattern provided on the substrate and placed in opposition to the first conductive pattern, a third conductive pattern provided on the substrate, a fourth conductive pattern provided on the substrate and placed in opposition to the third conductive pattern, a ground potential portion placed around positions on the substrate where the first conductive pattern, the second conductive pattern, the third conductive pattern, and the fourth conductive pattern are placed, a first resistor connecting between the first conductive pattern and the second conductive pattern placed in opposition to each other, and a second resistor connecting between the third conductive pattern and the fourth conductive pattern placed in opposition to each other.

11 Claims, 22 Drawing Sheets

900

FIG. 23A TRANSMIT DATA SECTION
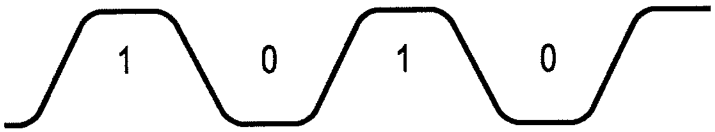
FIG. 23B TRANSMITTING ANTENNA OUTPUT
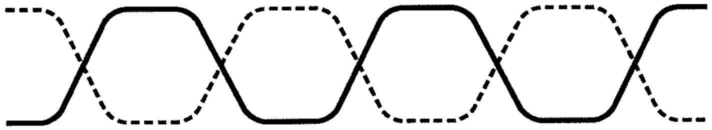
FIG. 23C RECEIVING ANTENNA INPUT
FIG. 23D COMPARATOR INPUT
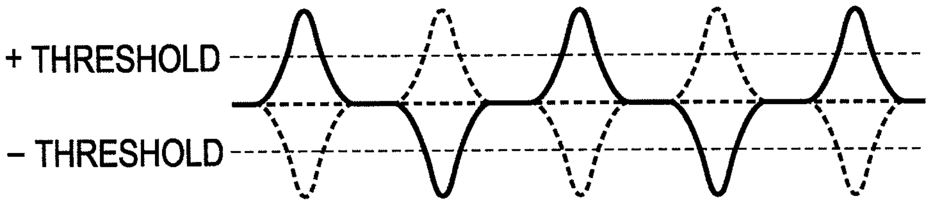
FIG. 23E RECEIVE DATA
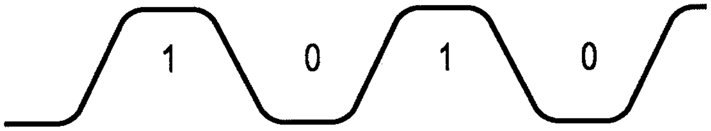

90

COUPLER AND COMMUNICATION SYSTEM

BACKGROUND OF THE INVENTION

1. Field of the Invention

The present invention relates to a coupler used for short range non-contact data transmission between two devices located in close proximity to each other, and a communication system including the coupler.

2. Description of the Related Art

In recent years, a variety of proposals have been made and are being put into practice for performing relatively high speed radio communication between two pieces of communication apparatus located in very close proximity to each other at a distance of about several millimeters to several centimeters. For example, it has been proposed to use part of the transmission path connecting between various kinds of information processing apparatus and their peripherals as a radio transmission path. FIG. 28 shows a general configuration for performing communication via the radio transmission path in this case.

As shown in FIG. 28, a first device 10 includes a transmitting/receiving antenna 11, and a second device 20 includes a transmitting/receiving antenna 21, thereby allowing a bus connection between the transmitting/receiving antenna 11 and the transmitting/receiving antenna 12 by radio. Then, the transmitting/receiving antenna 11 and the transmitting/receiving antenna 21 are placed in close proximity to each other at a distance of, for example, several millimeters to perform two-way radio communication.

The communication apparatus shown in FIG. 28 according to the related art is shown in detail in FIG. 29. An antenna communication system 90 shown in FIG. 29 includes the first device 10 having the transmitting/receiving antenna 11, and the second device 20 having the transmitting/receiving antenna 21. The transmitting/receiving antennas 11 and 21 of the respective devices 10 and 20 are placed in close proximity to each other.

The first device 10 includes a data transmitting/receiving section 12, a transmission/reception separating circuit 13, an amplifier 14, a comparator 15, and the transmitting/receiving antenna 11. The transmitting/receiving antenna 11 is connected with the amplifier 14 to which a transmit signal is outputted, and is also connected with the comparator 15 to which a receive signal is inputted. The transmitting/receiving antenna 11 executes radio communication processing with the transmitting/receiving antenna 21 of the second device 20 located adjacent to the transmitting/receiving antenna 11. Transmit data generated in the data transmitting/receiving section 12 is supplied to the amplifier 14 via the transmission/reception separating circuit 13, and amplified in the amplifier 14 for transmission before being transmitted by radio from the transmitting/receiving antenna 11. Also, a signal received by the transmitting/receiving antenna 11 is supplied to the comparator 15, and the level of the receive signal is compared with a threshold. The comparison result is supplied to the data transmitting/receiving section 12 as receive data via the transmission/reception separating circuit 13.

The second device 20 that performs communication with the above-mentioned first device 10 is of the same configuration as the first device 10. That is, the second device 20 includes the transmitting/receiving antenna 21, a data transmitting/receiving section 22, a transmission/reception separating circuit 23, an amplifier 24, and a comparator 25.

FIGS. 23A to 23E are diagrams showing the states of communication processing in the respective devices 10 and 20.

Suppose that, as shown in FIG. 23A, transmit data in which "1"data (high level data) and "0"data (low level data) appear alternately on a bit-by-bit basis is transmitted by radio.

At this time, as indicated by the solid line in FIG. 23B, the output from the antenna on the transmitting side has a signal waveform in which the high level and low level of the transmit data appear as they are. It should be noted that in the case of transmission as differential signals, a signal waveform of inverse characteristic indicated by the broken line in FIG. 23B is also transmitted at the same time.

Upon outputting data from the antenna on the transmitting side in this way, at the antenna on the receiving side placed in close proximity, as shown in FIG. 23C, a derivative waveform is received in which a rate of change in transmit signal appears as a level. For this receive waveform as well, in the case of radio transmission as differential signals, a signal waveform of inverse characteristic is also detected as indicated by the broken line.

This receive waveform is amplified by an amplification function built in the comparator of the receiving system into a signal within a fixed range of level as shown in FIG. 23D, and compared with a threshold on the positive side and a threshold on the negative side. If, as a result of the comparison, the threshold on the positive side is crossed, the signal is held to a "1"data level, and if the threshold on the negative side is crossed, the signal is held to a "0"data level, resulting in the receive data shown in FIG. 23E. This receive data shown in FIG. 23E is the same data as the transmit data shown in FIG. 23A, indicating that radio transmission of the transmit data has been performed correctly.

An example of performing one-to-one high speed non-contact communication between pieces of apparatus located with short range of each other is described in Japanese Unexamined Patent Application No. 2006-186418.

SUMMARY OF THE INVENTION

However, according to the radio communication configuration as shown in FIG. 28, if both the devices 10 and 20 transmit signals at the same time, the signals transmitted from the transmitting/receiving antennas of the both devices overlap, causing attenuation or loss of the signals, which makes it difficult to perform communication correctly. For example, suppose that the transmit signal from the first device 10 is the signal shown in FIG. 30A, and the transmit signal from the second device 20 is the signal shown in FIG. 30B. Here, it is assumed that in the state in which data is being transmitted from the first device 10 as "010101", "0"data is transmitted as shown in FIG. 30B at the timing when "1"data is transmitted. This "0"data corresponds to a signal transmitted as an Ack signal as a reception acknowledgment response, and "1"data is transmitted from the second device 20 at other timings.

When data is transmitted at the timings shown in FIGS. 30A and 30B, the state of the signal passed between the antennas 11 and 21 becomes as shown in FIG. 30C. Receive data demodulated from this signal via the comparator is as shown in FIG. 30D, which reflects the transmit data shown in FIG. 30A as it is. Thus, the signal from the first device 10 can be received substantially correctly, except for the period during which the Ack signal is transmitted. In contrast, there is a possibility that the Ack signal from the second device 20 may not be correctly received by the first device 10.

Specifically, the waveforms at the transmission start timing and transmission end timing for the Ack signal "0"signal are respectively represented by the signals at the positions indicated by c1 and c2 in FIG. 30C. Each of these signals attenuates or disappears as the last signal "1"from the first device and the Ack signal “0”signal from the second device overlap. Consequently, in some cases, the receive data shown in FIG. 30D to be received by the first device is not correctly received.

An example of related art technique aimed at preventing such signal attenuation or disappearance is use of radio connection via full-duplex communication. That is, two antennas, one dedicated to transmission and the other dedicated to reception, are used to ensure that the transmission from the first device to the second device and the transmission from the second device to the first device do not interfere with each other. Two-way communication can be thus accomplished without radio interference. However, the above-mentioned technique has problems in that two dedicated antennas are necessary, twice or more area is necessary for their installation, and the cost increases.

It is desirable to allow favorable short range radio communication to be performed in a space-saving manner and in two ways.

A coupler according to an embodiment of the present invention includes a first conductive pattern provided on a substrate having insulating property, a second conductive pattern provided on the substrate and placed in opposition to the first conductive pattern, a third conductive pattern provided on the substrate, and a fourth conductive pattern provided on the substrate and placed in opposition to the third conductive pattern, a ground potential portion placed around positions on the substrate where the first conductive pattern, the second conductive pattern, the third conductive pattern, and the fourth conductive pattern are placed, a first resistor connecting between the first conductive pattern and the second conductive pattern placed in opposition to each other, and a second resistor connecting between the third conductive pattern and the fourth conductive pattern placed in opposition to each other.

A communication system according to an embodiment present invention performs communication by placing a first coupler placed in a first device and a second coupler placed in a second device in close proximity to each other, and each of the couplers includes a first conductive pattern provided on a substrate having insulating property, a second conductive pattern provided on the substrate and placed in opposition to the first conductive pattern, a third conductive pattern provided on the substrate, a fourth conductive pattern provided on the substrate and placed in opposition to the third conductive pattern, a ground potential portion placed around positions on the substrate where the first conductive pattern, the second conductive pattern, the third conductive pattern, and the fourth conductive pattern are placed, a first resistor connecting between the first conductive pattern and the second conductive pattern placed in opposition to each other, and a second resistor connecting between the third conductive pattern and the fourth conductive pattern placed in opposition to each other.

In this way, the four conductive patterns on one substrate are placed adjacent to each other, and each of the conductive patterns functions as a transmitting electrode or receiving electrode with respect to the adjacent coupler.

BRIEF DESCRIPTION OF THE DRAWINGS

FIGS. 23A to 23E are waveform diagrams showing an example of radio transmission signals;

DESCRIPTION OF THE PREFERRED EMBODIMENTS

Hereinbelow, an embodiment of the present invention will be described in the following order of topics.

1. Outer Shapes of Couplers (FIGS. 1 to 3)
2. Example of Resistor Placement in Coupler (FIGS. 4 to 11)
3. Example of Mounting of Modules to which Communication System according to First Embodiment is applied (FIGS. 12A to 15B)
4. Example of Placement of Plurality of Planar antennas to which Communication System according to First Embodiment is applied (FIGS. 16 to 19)
5. Example of Configuration of Communication System (FIG. 20)
6. Example of Transmit Process by Communication System according to First Embodiment (FIG. 21)
7. Example of Receive Process by Communication System according to First Embodiment (FIG. 22)
8. Example of Signal State between Antennas of Communication System according to First Embodiment (FIGS. 23A to 24D)
9. Modifications of First Embodiment (FIGS. 25 to 27B)

[1. Outer Shapes of Couplers]

This embodiment presents a system that performs short range radio communication via pulses without using carrier waves, and is configured as a coupler in which a first substrate 110 having a coupler as a transmitting/receiving antenna, and a second substrate 120 having a coupler as a transmitting/receiving antenna are placed in close proximity to each other. In the following description, each of these substrates will be referred to as coupler in some cases.

The signal state for performing radio communication via pulses without using carrier waves is as described above in the Background Art section. That is, binary transmit data of high level or low level of the antenna on the transmitting side is outputted as it is, and received by the antenna on the receiving side placed in close proximity. At the antenna on the receiving side, the transmit signal is detected as a derivative signal indicating its rate of change.

Figure 1:
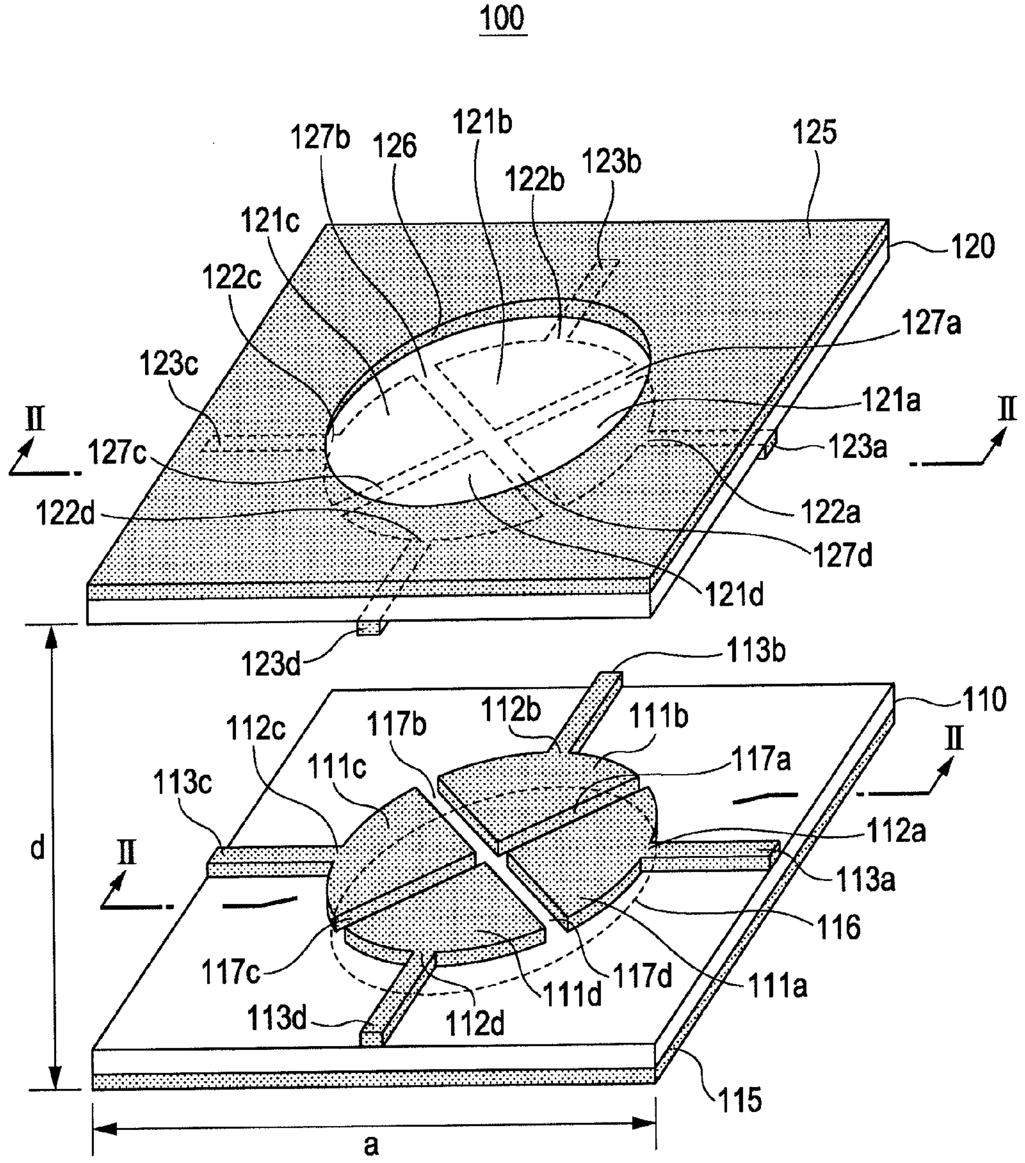
FIG. 1 is a perspective view showing a state in which couplers according to an embodiment of the present invention are opposed to each other.

The configuration shown in FIG. 1 is now described. In the substrate 110, four conductive patterns 111*a*, 111*b*, 111*c*, and 111*d* each having a shape obtained by dividing up a circle into four equally spaced parts are placed on the surface of an insulating substrate. Gaps 117*a*, 117*b*, 177*c*, and 117*d* as non-conductive portions are formed between the adjacent conductive patterns 111*a*, 111*b*, 111*c*, and 111*d*. A slot may be formed around the conductive patterns 111*a*, 111*b*, 111*c*, and 111*d* having a circular shape.

The four conductive patterns 111*a*, 111*b*, 111*c*, and 111*d* are respectively connected with feed patterns 113*a*, 113*b*, 113*c*, and 113*d* placed in four different directions away from the center. In the feed patterns 113*a*, 113*b*, 113*c*, and 113*d*, feeding points 112*a*, 112*b*, 112*c*, and 112*d* are provided as connecting points on the outer periphery of the four conductive patterns 111*a*, 111*b*, 111*c*, and 111*d*, respectively.

Also, a GND layer 115 as a ground potential portion is provided on a surface of the substrate 110 different from (in this example, a surface on the side opposite to) the surface on which the conductive patterns 111*a*, 111*b*, 111*c*, and 111*d* are placed. A hole 116 with no potential portion is provided at the center of the GND layer 115. The hole 116 is slightly larger in diameter than the circle formed by the four conductive patterns 111*a*, 111*b*, 111*c*, and 111*d*.

The substrate 120 on the other side also has the same configuration, and is opposed to the substrate 110. That is, four conductive patterns 121*a*, 121*b*, 121*c*, and 121*d* each having a shape obtained by dividing up a circle into four equally spaced parts are placed on the surface of the insulating substrate 120. Gaps 127*a*, 127*b*, 127*c*, and 127*d* as non-conductive portions are formed between the adjacent conductive patterns 121*a*, 121*b*, 121*c*, and 121*d*.

The four conductive patterns 121*a*, 121*b*, 121*c*, and 121*d* are respectively connected with feed patterns 123*a*, 123*b*, 123*c*, and 123*d* placed in four different directions away from the center. In the feed patterns 123*a*, 123*b*, 123*c*, and 123*d*, feeding points 112*a*, 112*b*, 112*c*, and 112*d* are provided as connecting points on the outer periphery of the four conductive patterns 121*a*, 121*b*, 121*c*, and 121*d*, respectively.

A GND layer 125 as a ground potential portion is provided on a surface of the substrate 120 different from (in this example, a surface on the side opposite to) the surface on which the conductive patterns 121*a*, 121*b*, 121*c*, and 121*d* are placed. A hole 126 with no potential portion is provided at the center of the GND layer 125. The hole 126 is slightly larger in diameter than the circle formed by the four conductive patterns 121*a*, 121*b*, 121*c*, and 121*d*.

While FIG. 1 depicts the two substrates 110 and 120 as being separated by a relatively large spacing d, in actuality, radio communication is performed with these substrates placed in very close proximity to each other separated by a spacing d of several millimeters or less.

Figure 2:
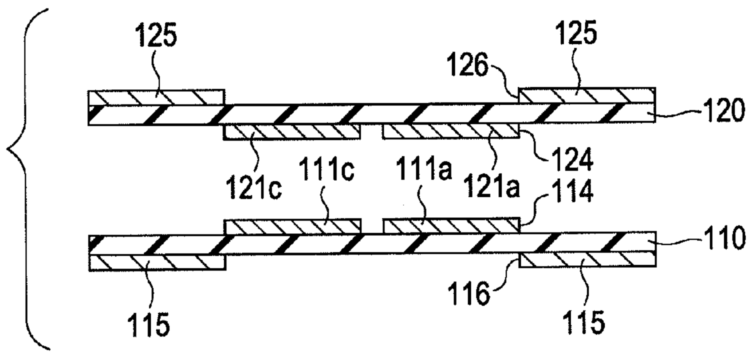
FIG. 2 is a cross-sectional view taken along a line II-II of FIG. 1.

FIG. 2 is a cross-sectional view showing these two substrates 110 and 120. As shown in FIG. 2, the conductive patterns 111*a*, 111*b*, 111*c*, and 111*d* and the conductive patterns 112*a*, 112*b*, 112*c*, and 112*d* having the same shape are placed opposed to each other.

It should be noted that as will be described later, each two mutually opposed patterns of the four conductive patterns are connected by a resistor. The connection state of the resistor will be described later.

Figure 3:
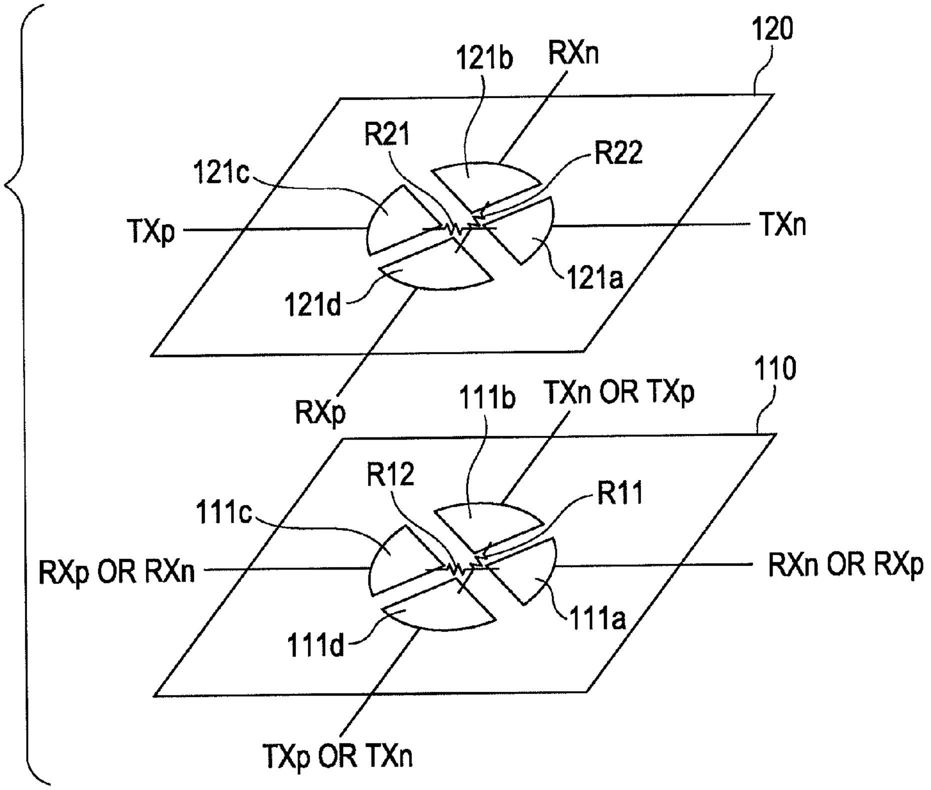
FIG. 3 is an explanatory diagram showing an example of the state of transmission/reception by couplers according to an embodiment of the present invention.

FIG. 3 is a diagram showing the state of power feeding to each of the conductive patterns.

In the case of this example, differential signals of mutually opposite phases are transmitted. That is, on the substrate 110 side, transmit signals TXp and TXn as differential signals are prepared, and supplied to the conductive patterns 111*d* and 111*b* opposed to each other across the center. The two conductive patterns 111*b* and 111*d* are connected by a resistor R11.

Also, receive signals RXp and RXn as differential signals are obtained by the conductive patterns 111*c* and 111*a* opposed to each other. The two conductive patterns 111*a* and 111*c* are connected by a resistor R12.

On the other substrate 120 side, transmit signals TXp and TXn as differential signals are prepared, and supplied to the conductive patterns 121*c* and 121*a* opposed to each other across the center. The two conductive patterns 121*a* and 121*c* are connected by a resistor R21.

Also, receive signals RXp and RXn as differential signals are obtained by the conductive patterns 121*d* and 121*b*. The two conductive patterns 121*b* and 121*d* are connected by a resistor R22.

[2. Example of Resistor Placement in Coupler]

Next, connection of resistors in the individual conductive patterns will be described. While the following description is directed only to the antenna on the substrate 110 side, the resistor placement is the same for the antenna on the substrate 120 side shown in FIG. 1 as well.

Figure 4:
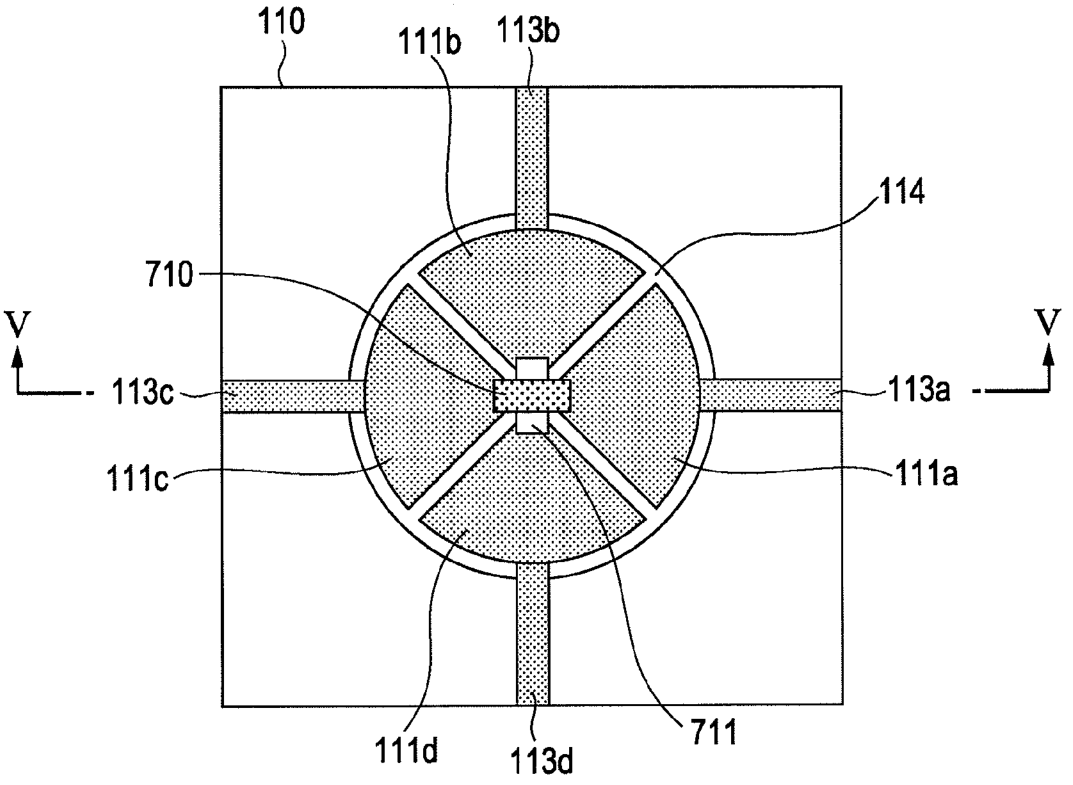
FIG. 4 is a plan view showing an example of placement of resistors in a coupler according to an embodiment of the present invention.
Figure 5:
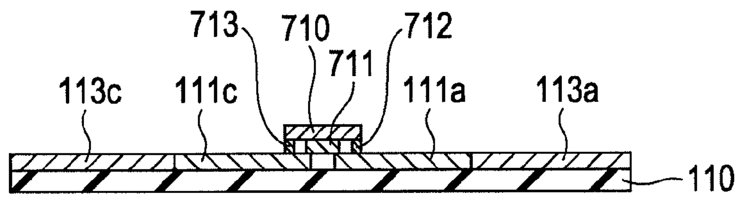
FIG. 5 is a cross-sectional view taken along a line V-V of FIG. 4.

In the example shown in FIGS. 4 and 5, in the outer shape indicated by the coupler 110 in FIG. 1, a resistor 710 connecting between the conductive patterns 111*a* and 111*c*, and a resistor 711 connecting between the conductive patterns 111*b* and 111*d* are provided.

In this example, the resistor 711 is placed on top of the surface on which the conductive patterns are placed, and the resistor 710 is placed further on top of the resistor 711. The resistor 710 is connected to the conductive patterns via wires 712 and 713.

In this example, the resistors 710 and 711 are present on the surface formed by the conductive patterns. It should be noted that since signals undergo heat transfer from the antenna patterns through the resistors 710 and 711, favorable transmission characteristics with little reflection can be obtained.

Figure 6:
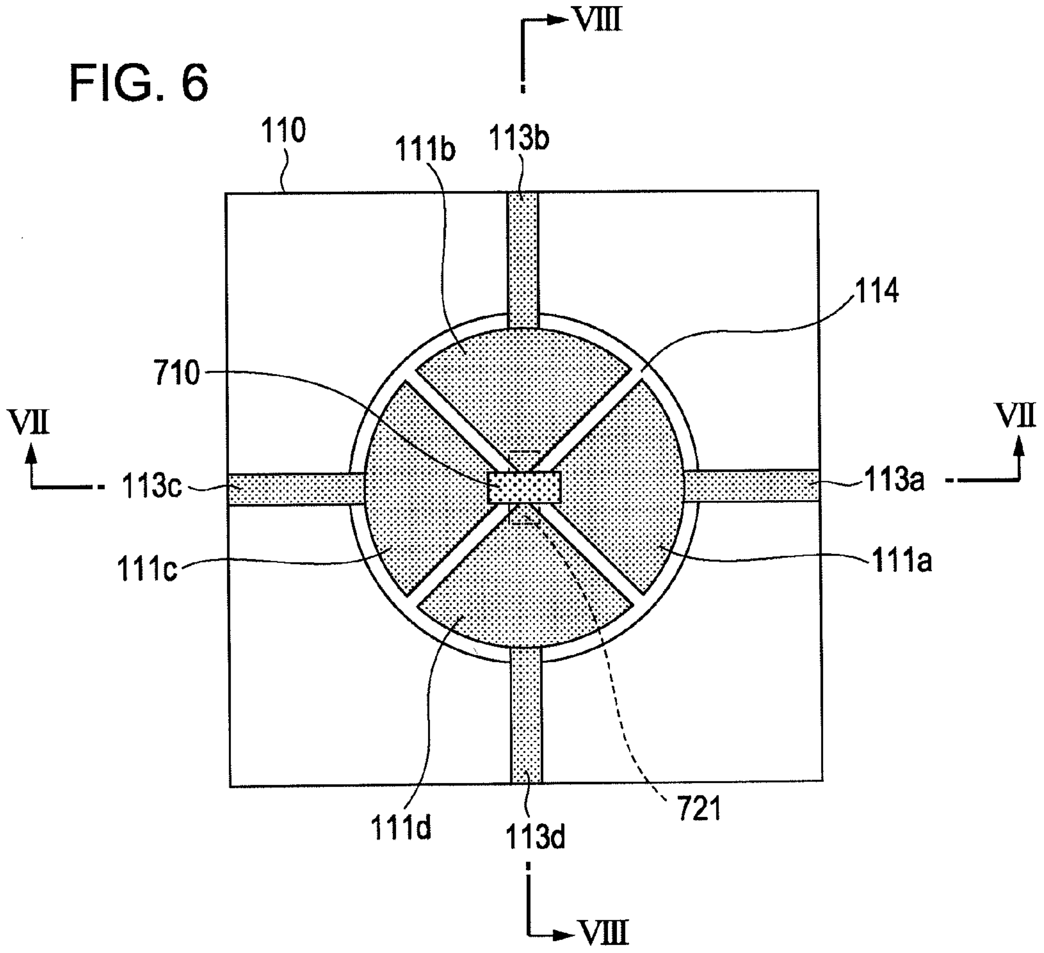
FIG. 6 is a plan view showing an example (Modification 1) of placement of resistors in a coupler according to an embodiment of the present invention.
Figure 7:
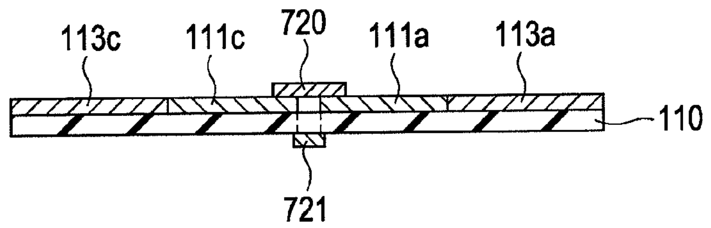
FIG. 7 is a cross-sectional view taken along a line VII-VII of FIG. 6.
Figure 8:
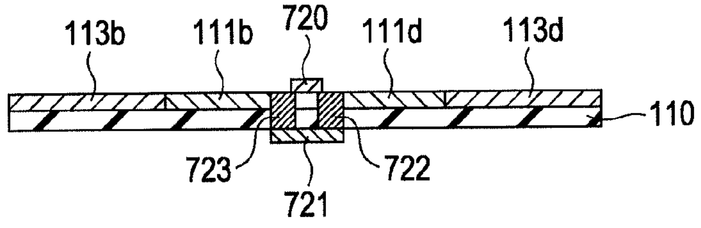
FIG. 8 is a cross-sectional view taken along a line VIII-VIII of FIG. 6.

In the example shown in FIGS. 6 to 8, resistors 720 and 721 are placed separately on the front and back surfaces of the substrate 110, respectively. That is, the resistor 720 is provided on the side where the conductive patterns are placed, and the resistor 721 is provided on the opposite side (back surface side). As shown in FIG. 8, the resistor 721 on the back surface side is brought into continuity with the patterns on the front surface side via through holes 722 and 723.

Figure 9:
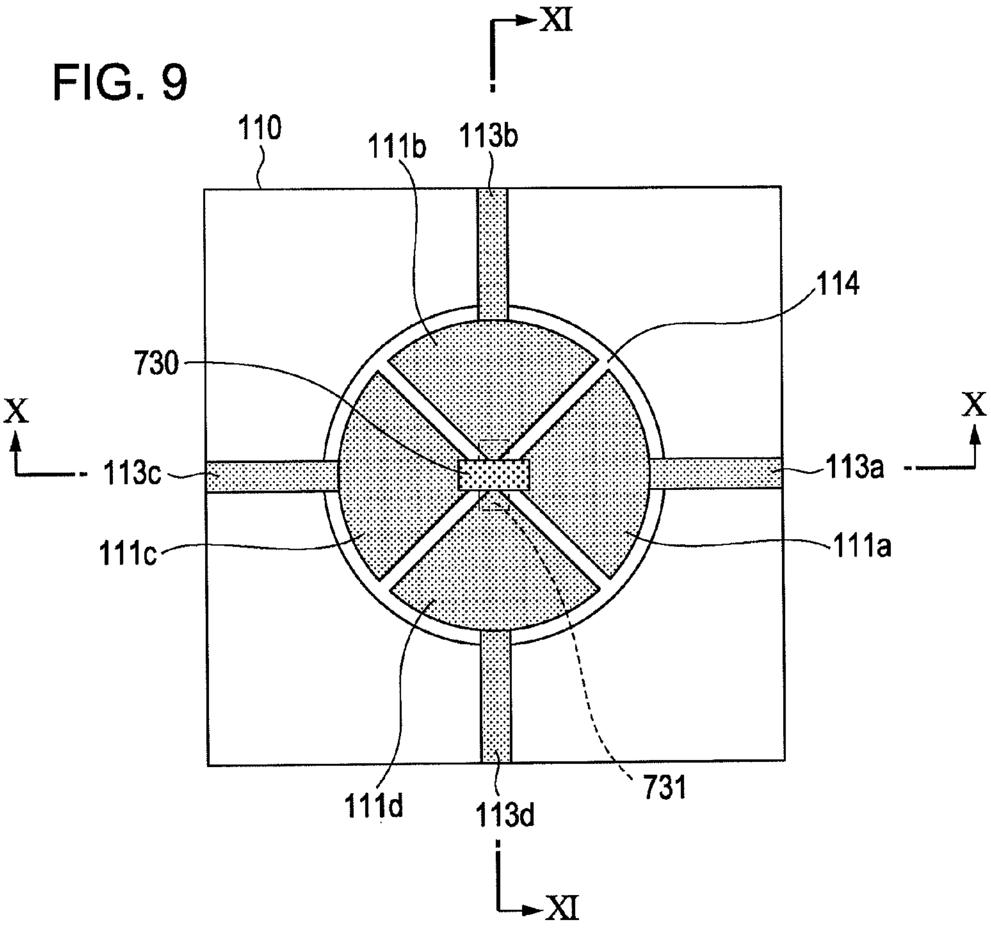
FIG. 9 is a plan view showing an example (Modification 2) of placement of resistors in a coupler according to an embodiment of the present invention.
Figure 10:
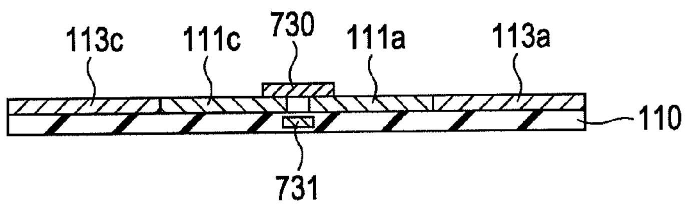
FIG. 10 is a cross-sectional view taken along a line X-X of FIG. 9.
Figure 11:
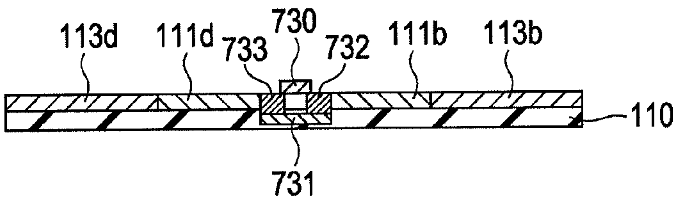
FIG. 11 is a cross-sectional view taken along a line XI-XI of FIG. 9.

In the example shown in FIGS. 9 to 11, resistors 730 and 731 are placed separately on the front surface and in the inside of the substrate 110, respectively. That is, the resistor 730 is provided on the side where the conductive patterns are placed, and the resistor 731 is provided in the inside of the substrate. As shown in FIG. 11, the resistor 731 in the inside is brought into continuity with the patterns on the front surface side via through holes 732 and 733.

[3. Example of Mounting of Modules to which Communication System According to First Embodiment is Applied]

Next, with reference to FIGS. 12A to 15B, a description will be given of an example of apparatus configuration to which the communication system according to this embodiment is applied. In this example, two devices each having an antenna placed therein are assumed to be a parent module and a child module. A radio communication section as a first device 300 described later is built in the parent module described below, and a radio communication section as a second device 400 described later is built in the child module.

Figure 12A:
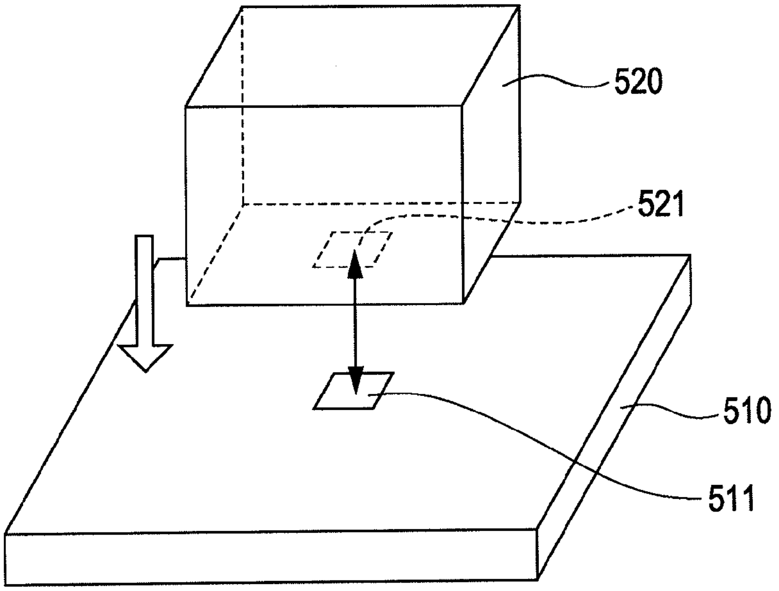
FIGS. 12A and 12B are perspective views (Example 1) showing an example of the shape of a child module to which a coupler according to an embodiment of the present invention is applied.
Figure 12B:
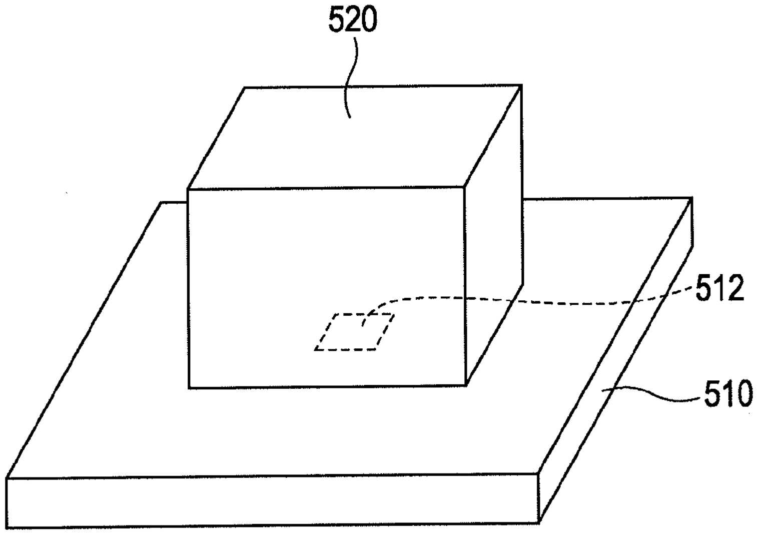

FIGS. 12A and 12B are diagrams showing an example in which planar antennas 511 and 521 are mounted in a parent module 510 and a child module 520, respectively. The planar antennas 511 and 521 correspond to the conductive patterns on each substrate in FIG. 1.

FIG. 12A shows a state before connection (i.e., separated state), and FIG. 12B shows a state in which the two modules 510 and 520 are brought into close proximity to each other for radio connection. In the example shown in FIGS. 12A and 12B, the planar antenna 511 installed at a predetermined position on one surface of the parent module 510, and the planar antenna 521 installed at a predetermined position on one surface of the child module 520 are opposed to each other as shown in FIG. 12A. In that state, the two antennas 511 and 521 are brought into close proximity so as to contact each other as shown in FIG. 12B. While FIG. 12B depicts the two antennas 511 and 521 as contacting each other, in actuality, the conductors of the respective antennas are prevented from coming into contact with each other when placed in close proximity to each other, such as by providing a slight gap of 1 mm or less between the two antennas 511 and 521.

Figure 13:
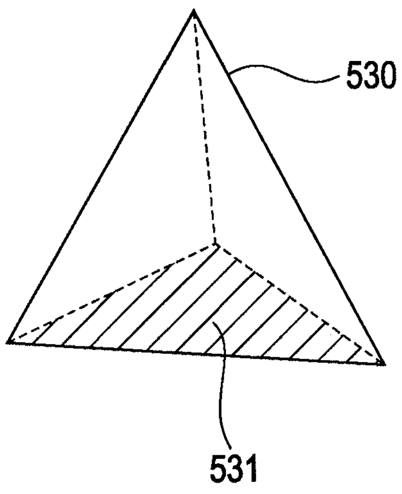
FIG. 13 is a perspective view (Example 2) showing an example of the shape of a child module to which a coupler according to an embodiment of the present invention is applied.
Figure 14:
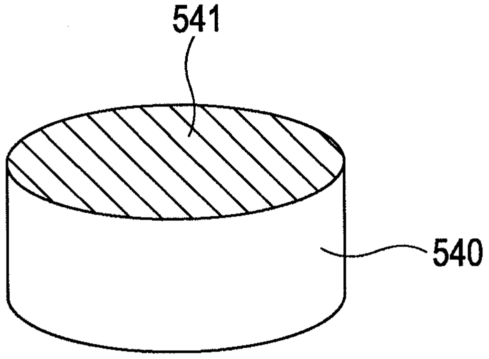
FIG. 14 is a perspective view (Example 3) showing an example of the shape of a child module to which a coupler according to an embodiment of the present invention is applied.

FIGS. 13 and 14 are perspective views each showing an example of another shape of the child module. FIG. 13 shows a child module 530 in the shape of a triangular pyramid, and its bottom surface serves as an antenna installation surface 531 for a planar antenna. FIG. 14 shows a child module 540 in the shape of a circular cylinder, and its top surface serves as an antenna installation surface 541 for a planar antenna. It should be noted that the antenna installation surface 531 and the antenna installation surface 541 are each a portion where an antenna as a coupler is installed, and a transmitting/receiving antenna is placed at substantially the center of each of the surfaces, for example.

Figure 15A:
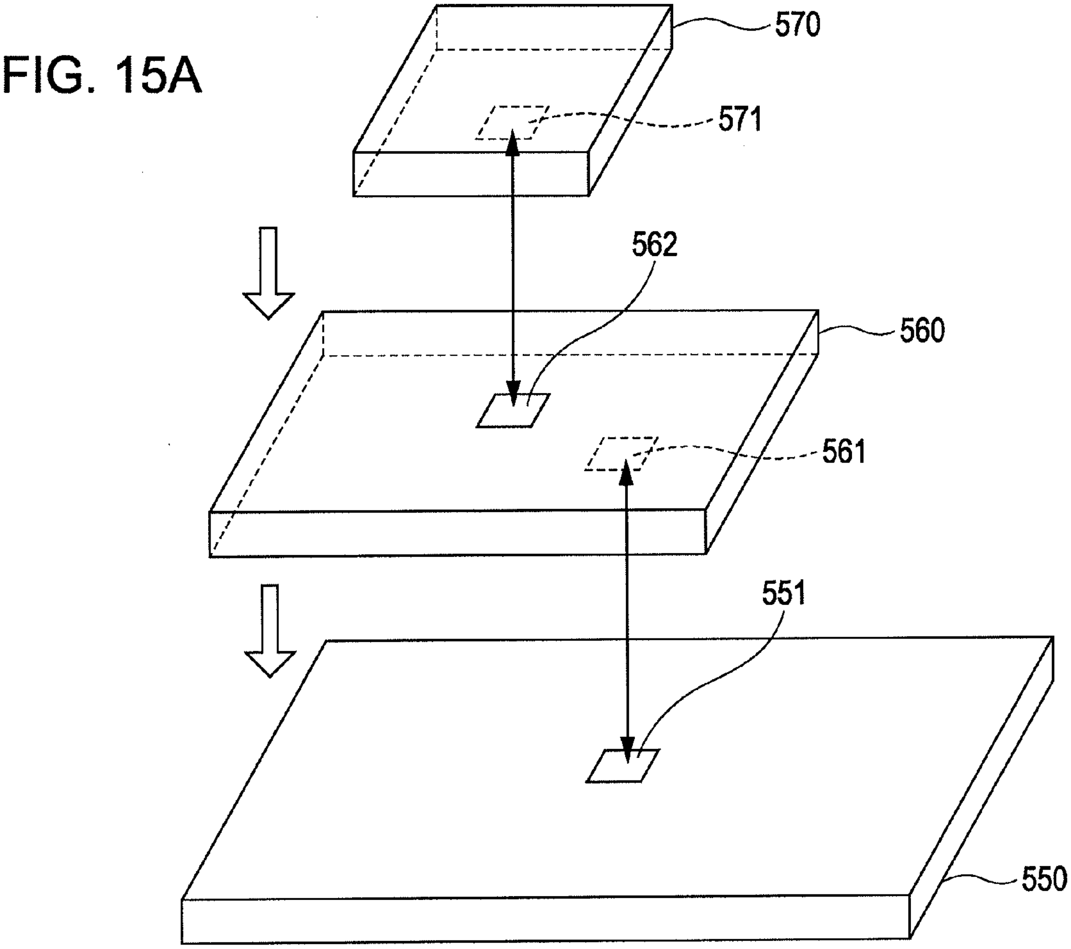
FIGS. 15A and 15B are respectively a perspective view showing an example of a parent module and two child modules to which couplers according to an embodiment of the present invention are applied, and a perspective view showing an example of the state in which the patent module and the two child modules are connected.
Figure 15B:
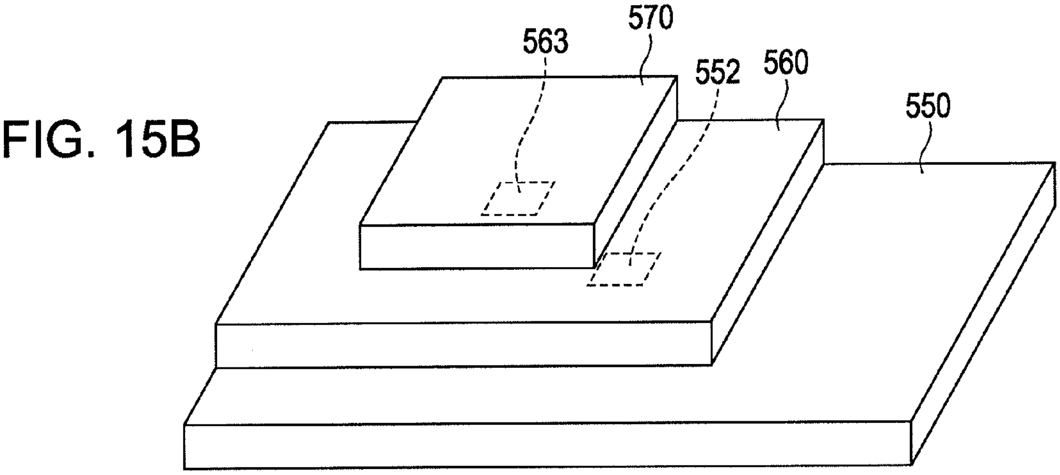

Next, an example in which three modules are prepared is shown in FIGS. 15A and 15B. In this case, two child modules are prepared.

As shown in FIG. 15A, a parent module 550, a first child module 560, and a second child module 570 are prepared. In the parent module 550, a planar antenna 551 is installed at a predetermined position on the upper surface of the module. In the first child module 560, a planar antenna 561 is installed at a predetermined position on the lower surface of the module, and a planar antenna 562 is installed at a predetermined position on the upper surface of the module. In the second child module 570, a planar antenna 571 is installed at a predetermined position on the lower surface of the module. The first child module 560 is equipped with two communication processing sections, including a radio communication processing section for performing radio communication with the parent module 550 and a radio communication processing section for performing radio communication with the second child module 570.

Then, as indicated by the arrow in FIG. 15A, the first child module 560 is put on the parent module 550, and the second child module 570 is put on the first child module 560, resulting in the state in which these modules are laid on top of one another as shown in FIG. 15B. In the state shown in FIG. 15B, the first child module 560 is installed on top of the parent module 550 in such a way that the planar antenna 551 of the parent module 550 and the planar antenna 561 are brought together. Further, the second child module 570 is installed on top of the first child module 560 in such a way that the planar antenna 562 and the planar antenna 571 are brought together. That is, the parent module 550 is brought into radio connection with the first child module 560, and the first child module 560 is brought into radio connection with the second child module 570.

As described above, the communication system can be configured with various module shapes. While FIGS. 12A to 15B depicts the parent module as one module and the child module as the other module for the convenience of description, either of the modules may be the parent module or the child module.

[4. Example of Placement of Plurality of Planar Antennas to which Communication System According to First Embodiment is Applied]

As an example of application of the communication system according to this embodiment, with reference to FIGS. 16 to 19, an example will be described in which a plurality of planar antennas are placed on predetermined surfaces of a parent module and a child module.

The plurality of planar antennas are configured to individually perform radio communication. For example, by providing three antenna pairs, three separate lines of data are transmitted simultaneously.

In the case of such a configuration in which the plurality of antennas are provided, it is necessary to make each individual antenna be accurately opposed to a predetermined corresponding antenna. Accordingly, in the example in FIG. 16, antennas are placed in a line in each of the modules, and magnets are provided in the modules so as to be in close proximity to the line of placed antennas, thereby bringing the two modules into contact with each other through accurate positioning by magnetic force. Also, in the examples shown in FIGS. 17 and 18, a magnet is provided in one module, and a magnetic sensor for detecting the magnetic force of the magnet is installed in the other module, thereby enabling positioning.

Hereinbelow, various examples of arrangement of a plurality of planar antennas will be described in order.

Figure 16:
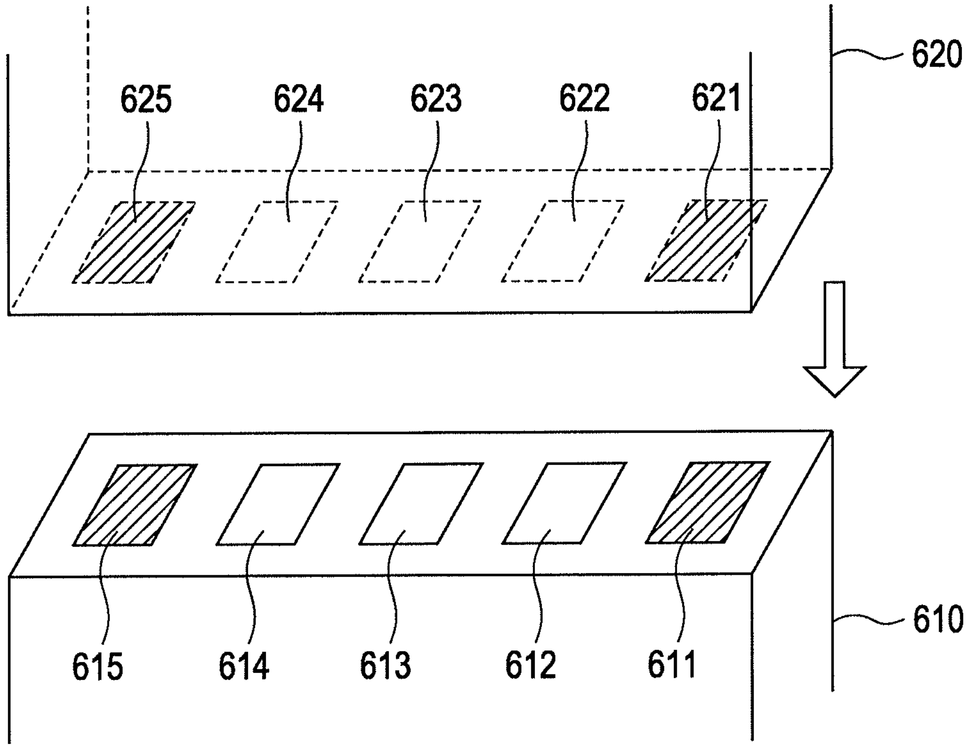
FIG. 16 is a perspective view showing a case in which three couplers and two magnets are placed in each of a parent module and a child module to which couplers according to an embodiment of the present invention are applied.

FIG. 16 is a diagram showing an example in which a plurality of planar antennas and a plurality of magnets are placed on the surfaces of a parent module 610 and a child module 620 facing each other. In the parent module 610, a magnet 611, a planar antenna 612, a planar antenna 613, a planar antenna 614, and a magnet 615 are placed so as to be arranged in a straight line from the right side on one predetermined surface. In the child module 620, a magnet 621, a planar antenna 622, a planar antenna 623, a planar antenna 624, and a magnet 625 are placed so as to be arranged in a straight line from the right side on the surface facing the parent module 610. The placement intervals of these components in the two modules 610 and 620 are set to be equal.

Since magnets are placed at both ends of the parent module 610 and the child module 620 in this way, the parent module 610 and the child module 620 stick to each other by magnetic force. That is, positioning of the pairs of the planar antenna 612 and the planar antenna 622, the planar antenna 613 and the planar antenna 623, and the planar antenna 614 and the planar antenna 624 can be performed with greater accuracy. While in this case positioning is done by magnets, positioning may be done by a mechanical mechanism without using magnets. For example, screwing, lock mechanism, or the like may be provided.

Further, while two magnets are used in this case, one or three or more magnets may be used. Use of a plurality of magnets provides for a more firm fixation.

Figure 17:
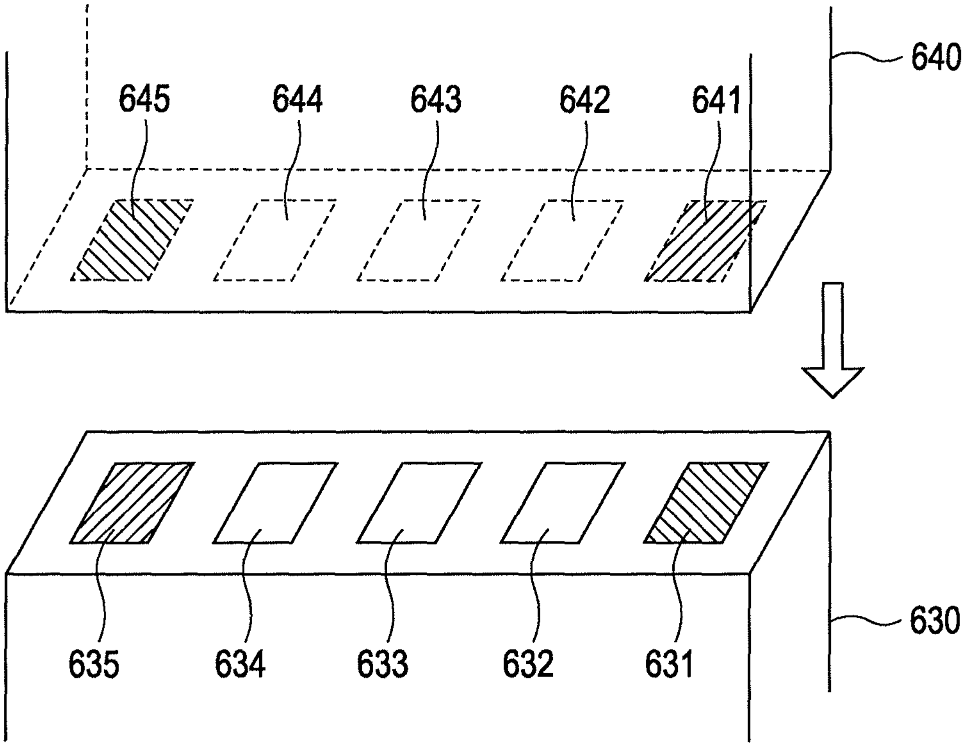
FIG. 17 is a perspective view showing a case in which three couplers, one magnet, and one magnetic sensor are placed in each of a parent module and a child module to which couplers according to an embodiment of the present invention are applied.

FIG. 17 is a diagram showing an example in which a plurality of planar antennas, magnets, and magnetic sensors are placed on the opposed surfaces of a parent module 630 and a child module 640. In the parent module 630, a magnetic sensor 631, a planar antenna 632, a planar antenna 633, a planar antenna 634, and a magnet 635 are placed so as to be arranged in a straight line from the right side on one predetermined surface. In the child module 640, a magnetic sensor 641, a planar antenna 642, a planar antenna 643, a planar antenna 644, and a magnetic sensor 645 are placed so as to be arranged in a straight line from the right side on one surface opposed to the parent module 630. The magnetic sensors and the magnets in this case are used to measure the distance between the parent module 630 and the child module 640. This makes it possible to determine whether or not the child module 640 and the parent module 630 have been placed in close proximity to each other so as to allow radio communication. By using the determined signal, it is possible to control power supply to the child module, or control transmission/reception of radio signals. Also, while two sets of magnet and magnetic sensor are used in this case, one set or three or more sets of magnet and magnetic sensor may be used. Further, placing a plurality of such sets provides for more accurate positioning for antenna placement. Further, some of the plurality of placed magnets may stick to magnets in the other module to thereby effect positioning as in the example shown in FIG. 16.

Figure 18:
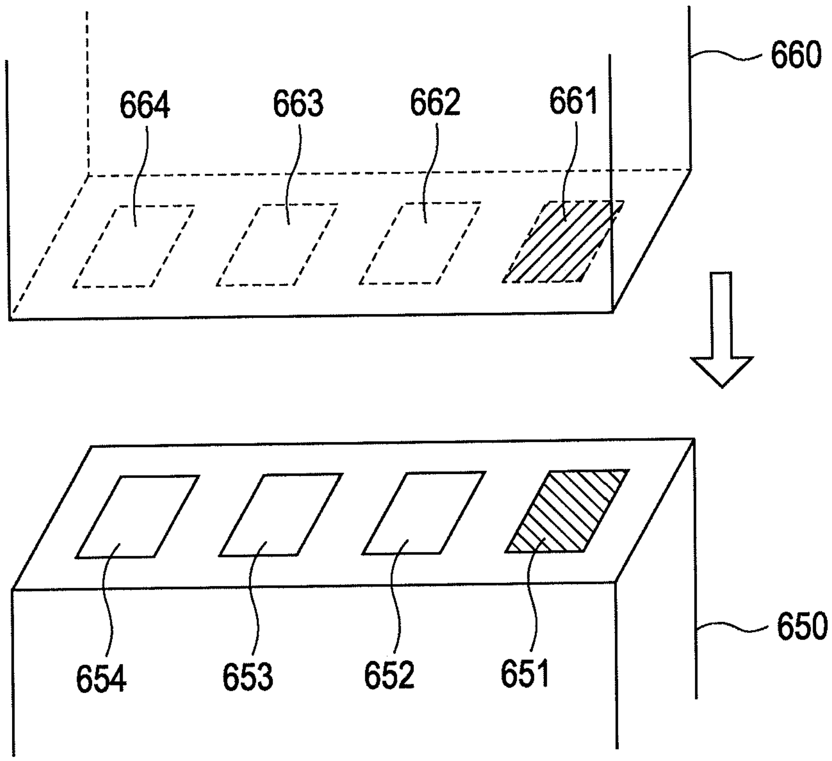
FIG. 18 is a perspective view showing a case in which three couplers, and one magnet or one magnetic sensor are placed in each of a parent module and a child module to which couplers according to an embodiment of the present invention are applied.
Figure 19:
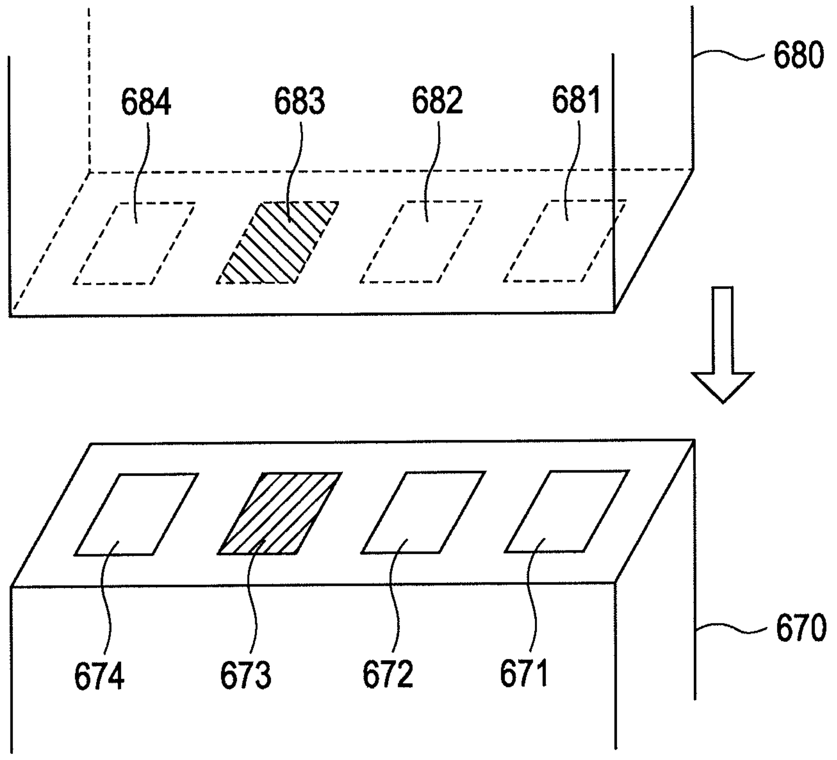
FIG. 19 is a perspective view showing a case in which three couplers, and one magnet or one magnetic sensor are placed in each of a parent module and a child module to which couplers according to an embodiment of the present invention are applied.

FIGS. 18 and 19 are diagrams showing modifications of the example shown in FIG. 17.

FIG. 18 is a diagram showing an example in which a plurality of planar antennas, a magnet, and a magnetic sensor are placed on the surfaces of a parent module 650 and a child module 660 facing each other. In the parent module 650, a magnetic sensor 651, a planar antenna 652, a planar antenna 653, and a planar antenna 654 are placed so as to be arranged in a straight line from the right side on one predetermined surface. In the child module 660, a magnet 661, a planar antenna 662, a planar antenna 663, and a planar antenna 664 are placed so as to be arranged in a straight line from the right side on one surface facing the parent module 650.

FIG. 19 is a diagram showing an example in which a plurality of planar antennas, magnets, and magnetic sensors are placed on the surfaces of a parent module 670 and a child module 680 facing each other. In the parent module 670, a planar antenna 671, a planar antenna 672, a magnet 673, and a planar antenna 674 are placed so as to be arranged in a straight line from the right side on one predetermined surface. In the child module 680, a planar antenna 681, a planar antenna 682, a magnetic sensor 683, and a planar antenna 684 are placed so as to be arranged in a straight line from the right side on one surface facing the parent module 670.

Incidentally, three planar antennas are used in the configurations shown in FIGS. 16 to 19. This is because three lines are necessary in the case of an interface such as SPI (Serial Peripheral Interface). It should be noted that in the case of an I2C (inter-Integrated Circuit) interface, since two lines, SCL and SDA, are necessary, two antennas are used. However, even in the case of the I2C interface, three antennas may be installed to perform communication and electric power transfer between SCL and SDA. That is, while the configurations shown in FIGS. 16 to 19 are directed to the case in which there are three antennas, if there are N signal lines to communicate data, N antennas are placed (N is a natural number). It should be noted that SCL refers to a serial clock line, which is a signal line for establishing synchronization. SDA refers to a serial data line, which is a two-way signal line whose input and output directions change with transmission and reception.

[5. Example of Configuration of Communication System]

Hereinbelow, an example of the internal configuration of the communication system according to the first embodiment of the present invention will be described with reference to FIG. 20.

Figure 20:
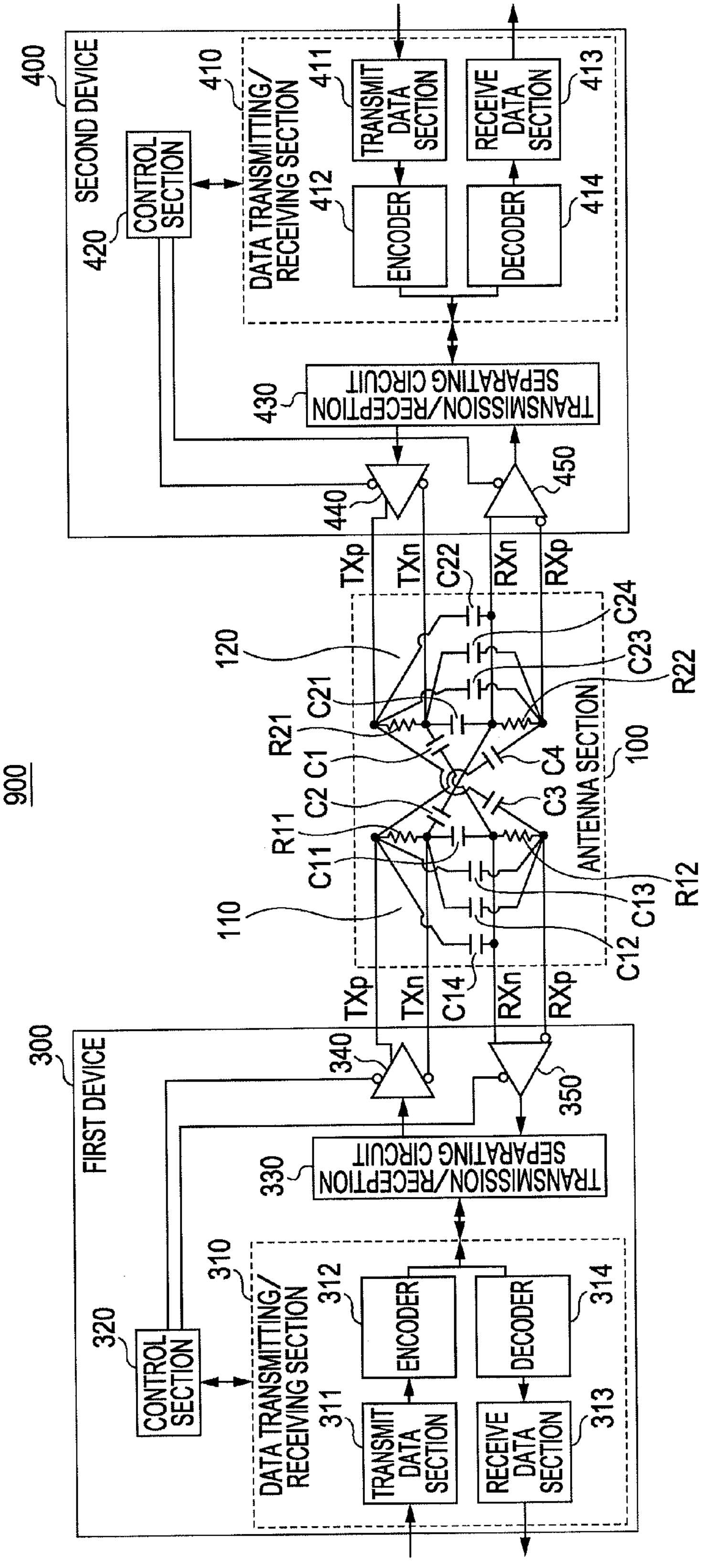
FIG. 20 is a configuration diagram showing an example of the configuration of a communication system to which couplers according to an embodiment of the present invention are connected.

A communication system 900 according to this embodiment shown in FIG. 20 is a system that performs short range radio communication via pulses without using carrier waves, and includes the first device 300 having the coupler 110, and the second device 400 having the coupler 120.

As for the signal state for performing radio communicated via pulses without using carrier waves, binary transmit data of high level or low level of the antenna on the transmitting side is outputted as it is, and received by the antenna on the receiving side placed in close proximity. At the antenna on the receiving side, the transmit signal is detected as a derivative signal indicating its rate of change.

The couplers 110 and 120 are configured to perform two-way communication of a digital signal as a signal on a bit-by-bit basis, which is the binary signal described above, between the first device 300 and the second device 400. The couplers 110 and 120 use the planar antennas as shown in FIG. 1. These antennas are opposed so as to face each other at short range, thereby enabling two-way communication.

The configuration of the first device 300 will be described. The first device 300 includes a data transmitting/receiving section 310. The data transmitting/receiving section 310 is a processing section that performs processing of transmit data and processing of receive data. For example, encoding for transmission, demodulation at reception after the encoding, decoding of received data, and the like are performed. A data processing section (not shown) inside the first device 300 is connected to the data transmitting/receiving section 310.

In the data transmitting/receiving section 310, a signal to be transmitted is received by a transmit data section 311 for conversion into a signal in the transmission format, the resulting signal in the transmission format is encoded by an encoder 312 for transmission, and the obtained transmit signal is outputted to a transmission/reception separating circuit 330.

The transmit signal outputted by the data transmitting/receiving section 310 is supplied to a transmitting amplifier 340 via the transmission/reception separating circuit 330. The transmitting amplifier 340 is configured as a three-state amplifier. In a three-state amplifier, during normal operation, when an inputted transmit signal is "1"data indicating high level, and when the transmit signal is "0"data indicating low level, the signal is amplified and outputted as "1"data or "0"data. In addition to this normal amplifying operation, the transmitting amplifier 340 allows the output to go into a high impedance state, thus functioning as a three-state amplifier having "1"data and "0"data output states and a high impedance state. The operation of switching the output to a high impedance state is set by a control signal from a control section 320 described later.

The output of the transmitting amplifier 340 is supplied to two conductive patterns of the coupler 110, and transmitted by radio from the first device 300. The conductive pattern to which a transmit signal is supplied and the conductive pattern by which a receive signal is obtained are as described above with reference to FIG. 3.

Next, a description will be given of processing of signals received by the coupler 110.

The coupler 110 as a transmitting/receiving antenna is connected with a comparator 350. The comparator 350 is configured to set comparison thresholds (a positive threshold and a negative threshold) on the basis of a reference potential, and compare a signal inputted from the coupler 110 side with the positive threshold and the negative threshold. It should be noted, however, that the level of a receive signal inputted to the comparator 350 has been adjusted to be within a fixed range by an automatic gain control circuit (so-called AGC (not shown)), and the level-adjusted signal is compared with the positive threshold and the negative threshold.

The comparator 350 is configured as, for example, a hysteresis comparator, which continues output of "1"data indicating high level when the receive level exceeds the positive threshold, and continues output of "0"data indicating low level when the receive level exceeds the negative threshold.

Further, the comparator 350 in this example can put the input side of a receive signal into a high impedance state. That is, in the normal state, the comparator 350 performs a comparing operation between an input signal and the positive threshold and the negative threshold, and when there is an instruction for switching to a high impedance state, the comparator 350 puts the input side into a high impedance state, and stops the comparing operation. This control for switching to a high impedance state is performed by a control signal from the control section 320.

The "1"data or "0"data outputted by the comparator 350 is supplied to the data transmitting/receiving section 310 via the transmission/reception separating circuit 330. In the data transmitting/receiving section 310, a decoding process for reception is performed on the data by a decoder 314, the decoded receive data is supplied to a receive data section 313, and extraction of the receive data is performed. The extracted receive data is supplied to the data processing section (not shown) inside the first device 300.

The control section 320 controls the transmit and receive processes at the data transmitting/receiving section 310, and performs control on the high impedance state in each of the transmitting amplifier 340 and the comparator 350. Details regarding the control process for switching to a high impedance state will be described later when explaining the flowcharts in FIGS. 21 and 22.

Next, a description will be given of the second device 400 that performs radio communication with the first device 300. The configuration for performing radio communication in the second device 400 is the same as that in the first device 300. That is, the device 400 includes a data transmitting/receiving section 410, a control section 420, a transmission/reception separating circuit 430, a transmitting amplifier 440, and a comparator 450. In FIG. 20, for portions that are the same between the first device 300 and the second device 400, the last two figures of their reference numerals are the same. Since the processing configuration for processing transmit and receive signals is completely the same, description of the specific processing configuration is omitted.

In the case of this example, the signals to be transmitted and received are differential signals, and capacitors are formed between adjacent conductive patterns placed in close proximity (antenna section 100). That is, capacitors C11, C12, C13, and 014 are formed between the conductive patterns (111*a* and 111*b*, 111*b* and 111*c*, 111*c* and 111*d*, and 111*d* and 111*a*) on the coupler 110 side. Also, capacitors C21, C22, C23, and C24 are formed between the conductive patterns (121*a* and 121*b*, 121*b* and 121*c*, 121*c* and 121*d*, and 121*d* and 121*a*) on the coupler 120 side. Then, capacitors C1, C2, C3, and C4 are formed in the gaps between the conductive patterns (111*a* and 121*a*, 111*b* and 121*b*, 111*c* and 121*c*, and 111*d* and 121*d*) of the two couplers 110 and 120. Resistors R11, R12, R21, and R22 connect differential signals to each other.

[6. Example of Transmit Process by Communication System according to First Embodiment]

Figure 21:
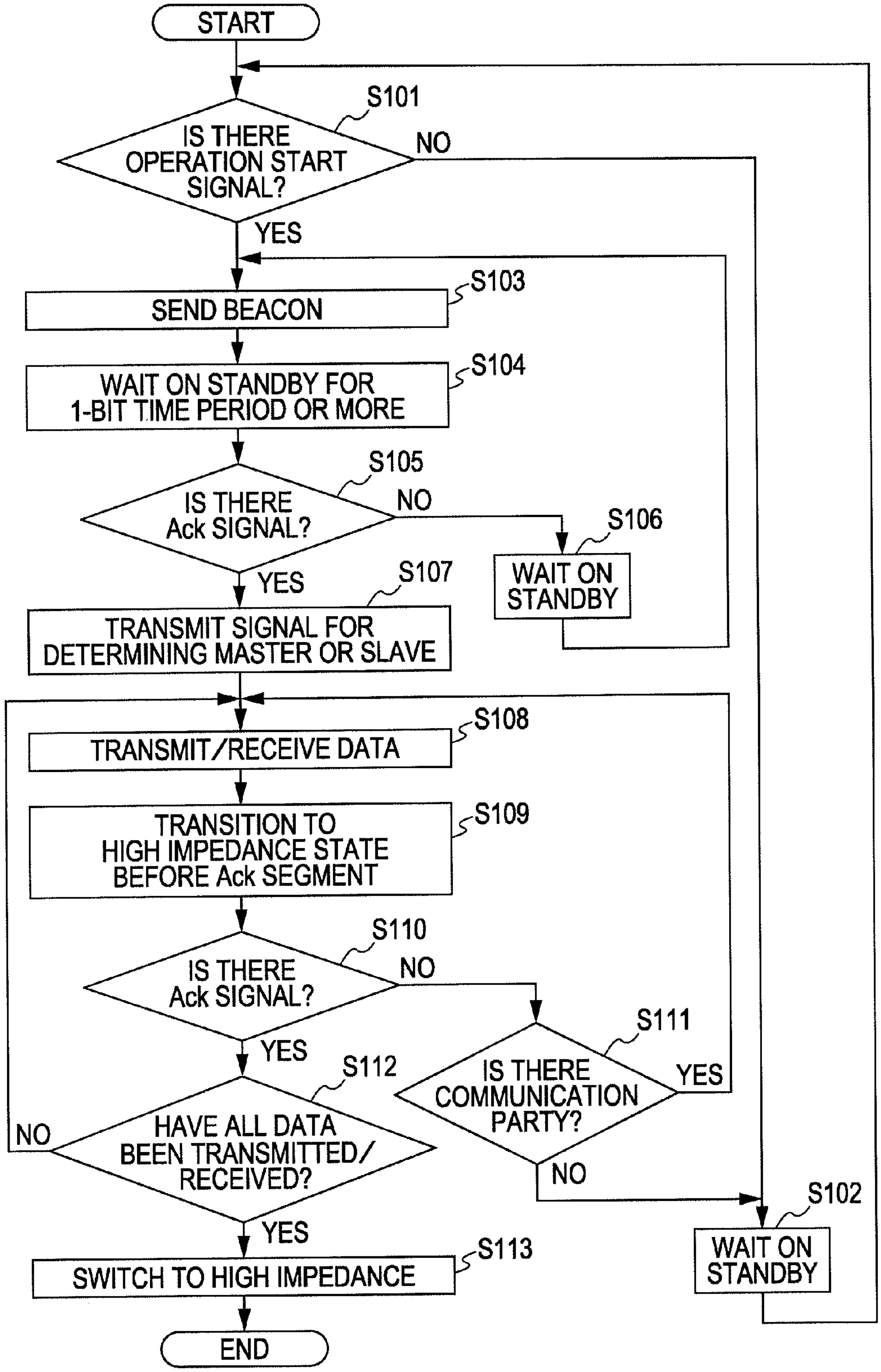
FIG. 21 is a flowchart showing an example of transmit process in a communication system according to an embodiment of the present invention.

Next, with reference to the flowchart in FIG. 21, a description will be given of a transmit process in the communication system 900 according to the first embodiment. This is performed when, for example, the first device 300 and the second device 400 shown in FIG. 20 are placed within short range of each other in very close proximity while being opposed to each other. The process of the flowchart in FIG. 21 is a process performed by the first device 300, and indicates a control process in the control section 320.

First, the control section 320 judges whether or not there is an operation start signal (step S101). It should be noted that this operation start signal is sent out by, for example, a section that detects when the two couplers 110 and 120 are placed facing each other at short range.

If there is no operation start signal, a standby state is temporarily entered (step S102), and after returning to step S101, it is judged whether or not there is an operation start signal.

If there is an operation start signal in step S101, a beacon is outputted as transmit data to be transmitted from the transmitting system circuit (step S103). Thereafter, the processing waits on standby for a predetermined time of 1-bit time period or more (step S104).

After the standby, it is judged by the control section 320 whether or not an Ack signal has been successfully received by the receiving system circuit (step S105). An Ack signal is a reception acknowledgment response signal indicating successful correct reception of transmit data by the other party, and is a signal of a predetermined pattern. If an Ack signal is not successfully received, a standby state is temporarily entered (step S106), and the processing returns to step S103 to transmit a beacon again.

Upon successful reception of an Ack signal, a signal for determining a master or slave is transmitted under control of the control section 320 (step S107). Thereafter, the actual data is transmitted/received between the first device 300 and the second device 400 (step S108).

Then, immediately before the segment where an Ack signal is received, the control section 320 causes the transmitting amplifier 340 shown in FIG. 20 to transition from a normal state to a high impedance state (step S109). The transition to the high impedance state is temporary, and the state is immediately returned to the original state at the timing when it is considered that reception of the Ack signal has been finished. For example, if the Ack signal is a 1-bit signal, the transmitting amplifier 340 is put in the high impedance state only for the period during which the 1-bit signal is received.

Then, it is judged whether or not the Ack signal has been successfully received by the receiving system (step S110). If the Ack signal is not successfully received, it is checked whether or not there is a communication party (step S111). If it is judged here that there is no communication party, a standby state is temporarily entered (step S102), and it is judged again whether or not there is an operation start signal (step S101). If there is a communication party, the processing returns to step S108, and transmission/reception of data is continued.

If the Ack signal has been successfully received in step S110, it is judged whether or not transmission/reception of all data has been finished (step S112). If transmission/reception of all data has not been finished, transmission/reception of data is continued (step S108). If transmission/reception of all data has been finished, the transmitting amplifier 340 shown in FIG. 20 is switched to a high impedance state from a normal state (step S113), and the transmit process is ended.

[7. Example of Receive Process by Communication System according to First Embodiment]

Next, with reference to FIG. 22, a description will be given of a receive process in the communication system 900 according to the first embodiment. This is performed when, for example, the first device 300 and the second device 400 shown in FIG. 20 are placed within short range of each other in very close proximity while being opposed to each other.

Figure 22:
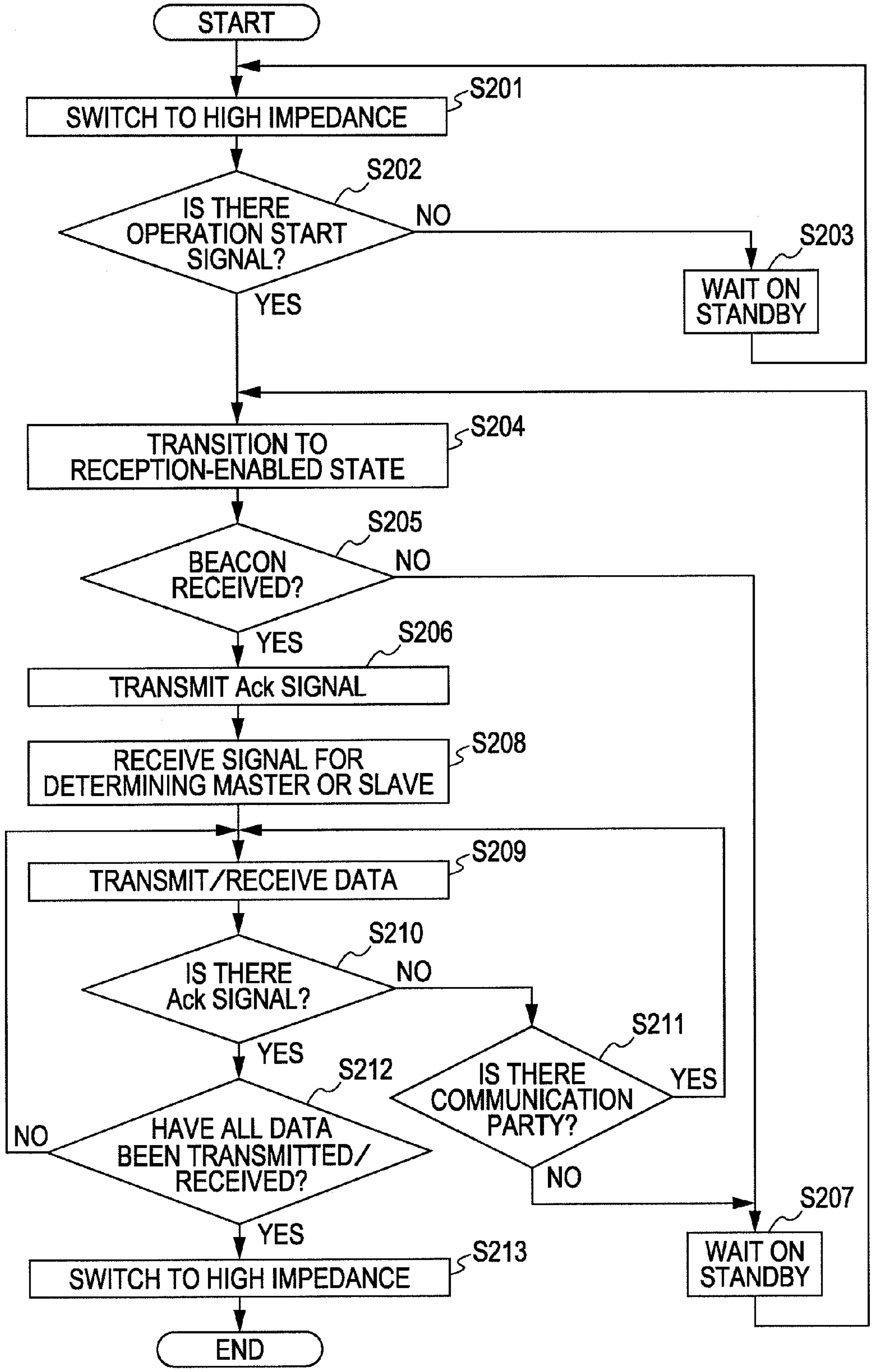
FIG. 22 is a flowchart showing an example of transmit process in a communication system according to an embodiment of the present invention.

The process of the flowchart in FIG. 22 is a process performed by the first device 300, and indicates a control process in the control section 320.

First, under control of the control section 320, the input side of the comparator 350 as the receiving system circuit is switched to a high impedance state (step S201). Then, it is judged whether or not there is an operation start signal (step S202). The judgment as to whether or not there is an operation start signal is the same as that in step S101 in the flowchart of FIG. 21, and is made on the basis of detection of the presence of the other party's device located in close proximity, or the like.

If an operation start signal is not detected by the control section 320, a standby state is temporarily entered (step S203), and after returning to step S201, the input side of the comparator 350 is switched to a high impedance state.

If an operation start signal is detected by the control section 320, the high impedance state of the comparator 350 is released into its normal state, causing the comparator 350 to wait on standby for reception of a beacon (step S204). Then, it is judged whether or not a beacon sent out from the opposed device has been received (step S205). If reception of a beacon is not successfully detected, a standby state is temporarily entered (step S207), and the processing returns to step S204 again to wait on standby for reception of a beacon.

If a beacon has been received, a process of transmitting an Ack signal to the sender is performed by the transmitting system terminal (step S206).

Thereafter, a signal for determining a master or slave, which is transmitted from the beacon sender, is received (step S208). Then, the actual data is transmitted/received between the first device 300 and the second device 400 (step S209).

It is judged whether or not there is an Ack signal to be transmitted to the beacon sender (step S210). If there is no Ack signal, it is checked whether or not the communication party's device is present in close proximity (step S211). If there is no device as the beacon sender, the processing returns to step S207 to temporarily wait on standby, and shifts to the reception enabled state in step S204. If the communication party's device is present in close proximity, the processing returns to step S209 and transmission/reception of data is continued.

If there is an Ack signal in step S210, it is judged whether or not transmission/reception of all data has been finished (step S212). If transmission/reception of all data has not been finished, transmission/reception of data in step S209 is continued. If transmission/reception of all data has been finished, the input side of the comparator 350 is switched to a high impedance state (step S213), and the receive process ends.

[8. Example of Signal State between Antennas of Communication System according to First Embodiment]

Next, with reference to FIGS. 23A to 24D, a description will be given of the signal state in which radio transmission is performed between the first device 300 and the second device 400 under this communication processing state.

First, the signal waveform transmitted between the couplers 110 and 120 will be described.

FIGS. 23A to 23E are diagrams showing the states of communication processing in the respective devices 300 and 400.

As shown in FIG. 23A, suppose that transmit data in which "1"data (high level data) and "0"data (low level data) appear alternately on a bit-by-bit basis is transmitted by radio.

At this time, as indicated by the solid line in FIG. 23B, the output from the antenna on the transmitting side has a signal waveform in which the high level and low level of the transmit data appear as they are. It should be noted that in the case of transmission as differential signals, a signal waveform of inverse characteristic indicated by the broken line in FIG. 23B is also transmitted at the same time.

Upon outputting data from the antenna on the transmitting side in this way, at the antenna on the receiving side placed in close proximity, as shown in FIG. 23C, a derivative waveform in which a rate of change in transmit signal appears as a level is received. For this receive waveform as well, in the case of radio transmission as differential signals, a signal waveform of inverse characteristic is also detected as indicated by the broken line.

This receive waveform is amplified by an amplification function built in the comparator of the receiving system into a signal within a fixed range of level as shown in FIG. 23D, and compared with a threshold on the positive side and a threshold on the negative side. If, as a result of the comparison, the threshold on the positive side is crossed, the signal is held to a "1"data level, and if the threshold on the negative side is crossed, the signal is held to a "0"data level, resulting in the receive data shown in FIG. 23E. This receive data shown in FIG. 23E is the same data as the transmit data shown in FIG. 23A, indicating that radio transmission of the transmit data has been performed correctly.

Next, an example of transmit data and receive data from each device will be described with reference to FIGS. 24A to 24D.

Figures 24A, 24B, 24C, 24D:
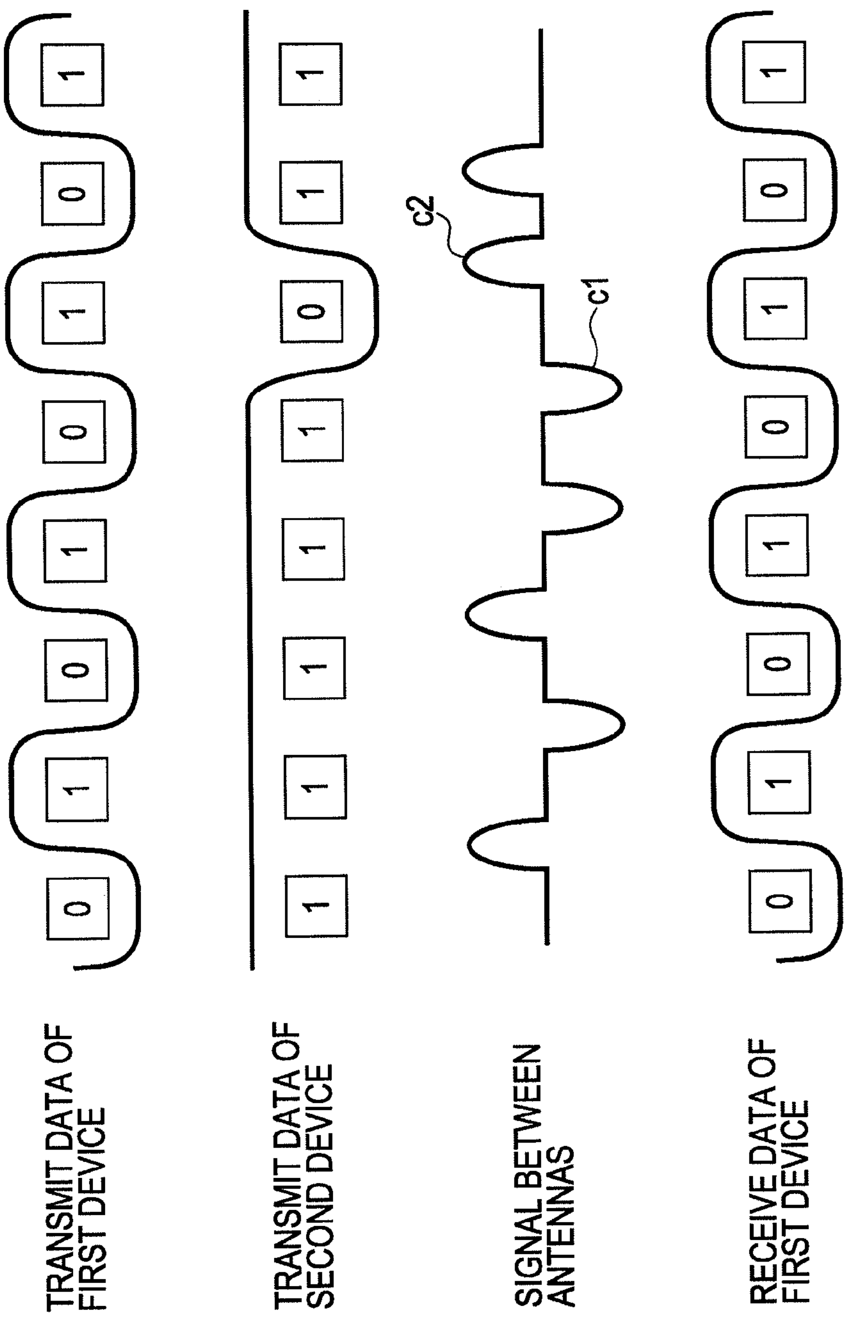
FIGS. 24A to 24D are timing diagrams showing an example of signal state in the case of a communication system according to an embodiment of the present invention.

First, it is assumed that in the first device 300, transmit data outputted by the encoder 312 is data in which "1"data and "0"data appear alternately as shown in FIG. 24A. Then, it is assumed that in the second device 400, as shown in FIG. 24B, an Ack signal as "0"data is outputted from the encoder 412 and transmitted in a 1-bit segment at a specific timing of the transmit data. The state in which "1"data is transmitted continues in portions other than the segment in which the Ack signal is transmitted in the second device 400.

FIG. 24C shows the signal waveform transmitted by radio between the two couplers 110 and 120 in this state. At each of the comparators 350 and 450 connected to the receiving-side antennas, a level corresponding to this waveform is detected.

In this embodiment, as described above with reference to the flowchart in FIG. 21, the output of the transmitting amplifier 340 of the first device 300 goes into a high impedance state in the segment in which an Ack signal is transmitted from the second device 400. Therefore, in the comparator 350 connected to the transmitting/receiving antenna of the first device, influence of transmit data from the first device is removed. Thus, the waveforms c1 and c2 (FIG. 24C) necessary for detecting an Ack signal as "0"data can be accurately detected at the comparator 350, thereby making it possible to correctly receive the Ack signal as a reception acknowledgment response.

Therefore, radio transmission can be performed in two ways simply by providing a pair of antennas in the devices 300 and 400, making it possible to reduce the antenna installation space or the like.

[9. Modifications of First Embodiment]

Next, modifications of the devices constituting the radio communication system according to the first embodiment will be described with reference to FIGS. 25 to 27B.

Figure 25:
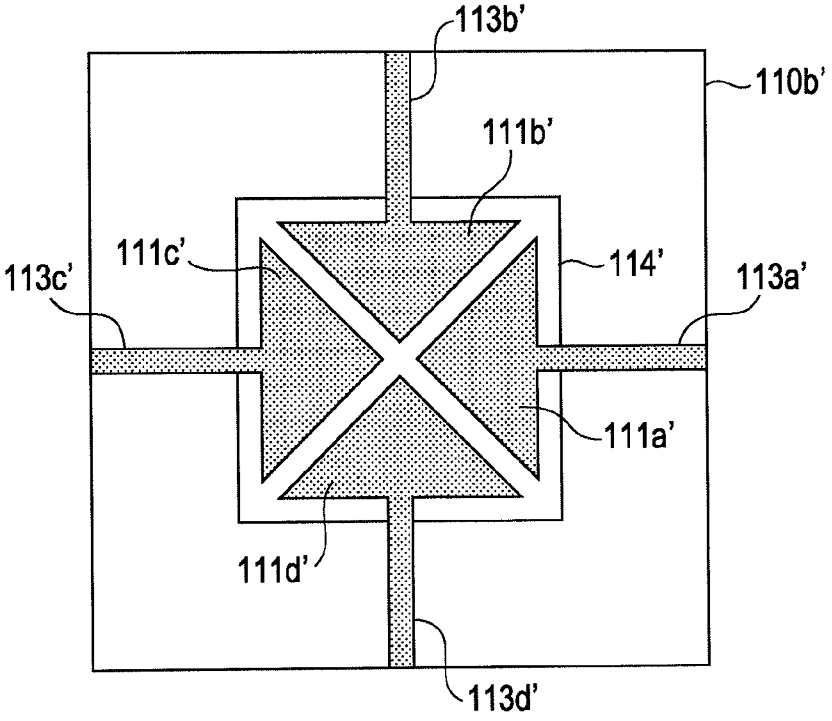
FIG. 25 is a plan view showing a modification (Example 1) of the shape of conductive patterns in a coupler according to an embodiment of the present invention.

In the example shown in FIG. 1, the conductive patterns 111*a* to 111*d* are formed in a circular shape. However, as shown in FIG. 25, for example, conductive patterns 111*a*' to 111*d*' obtained by dividing a square in four may be used as well. In the example shown in FIG. 25, the conductive patterns 111*a*' to 111*d*' divided in four each have a triangular shape, and are respectively connected with feed patterns 113*a*' to 113*d*'. A slot 114' provided around the outer periphery of the conductive patterns 111*a*' to 111*d*' also has a square shape.

Figure 26:
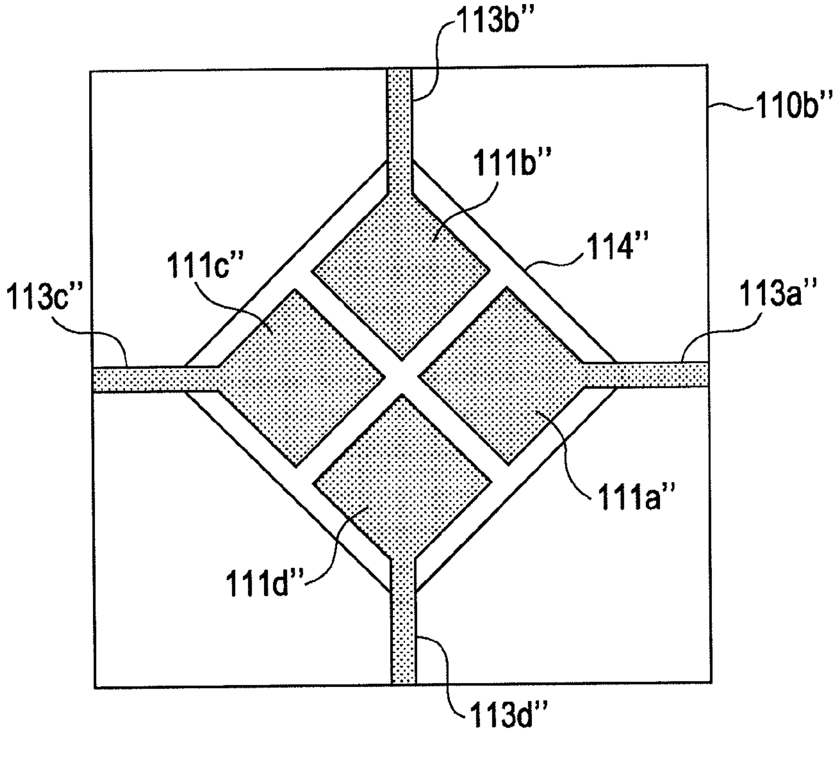
FIG. 26 is a plan view showing a modification (Example 2) of the shape of conductive patterns in a coupler according to an embodiment of the present invention.
Figure 27A:
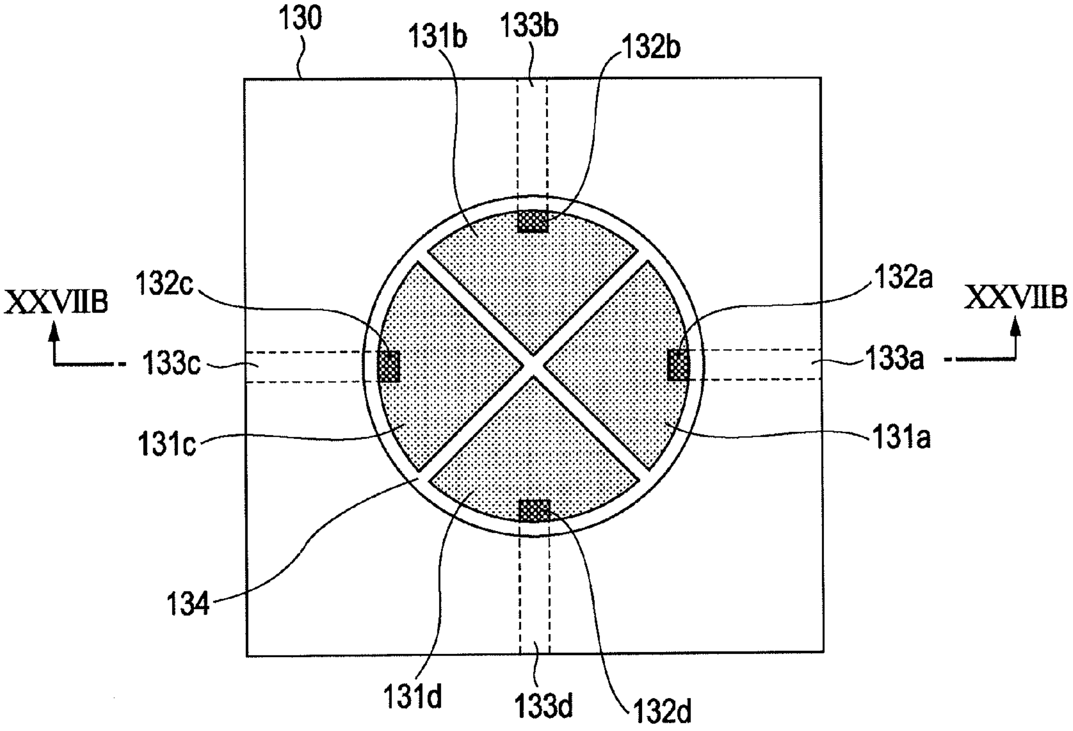
FIGS. 27A and 27B are respectively a plan view showing a still another modification of an embodiment of the present invention, and a cross-sectional view taken along a line XXVIIB-XXVIIB thereof.
Figure 27B:
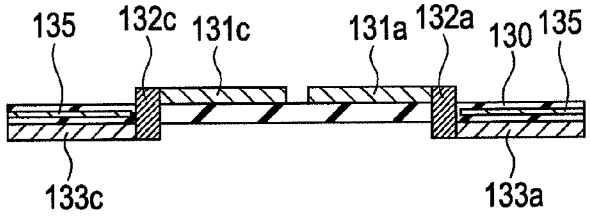
Figure 28:
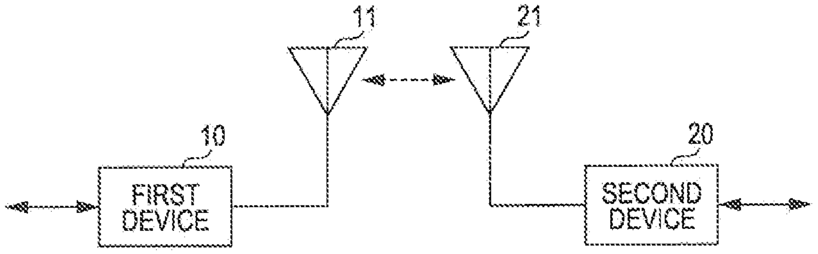
Related Art FIG. 28
FIG. 28 is a principle diagram showing an example of communication system according to the related art.
Figure 29:
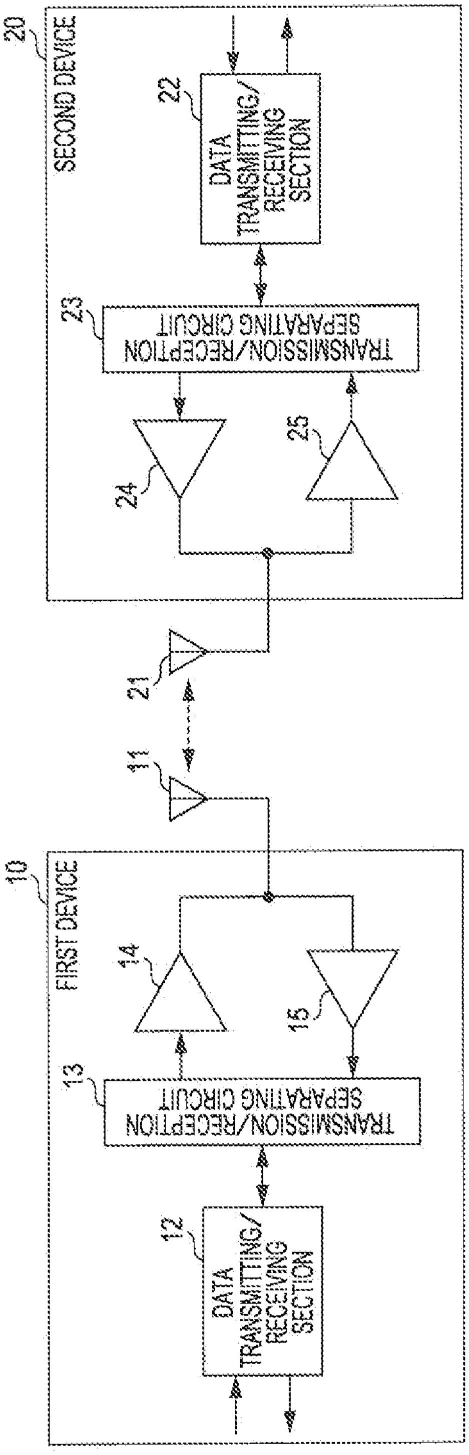
Related Art FIG. 29
FIG. 29 is a block diagram showing an example of communication system according to the related art.
Figures 30A, 30B, 30C, 30D:
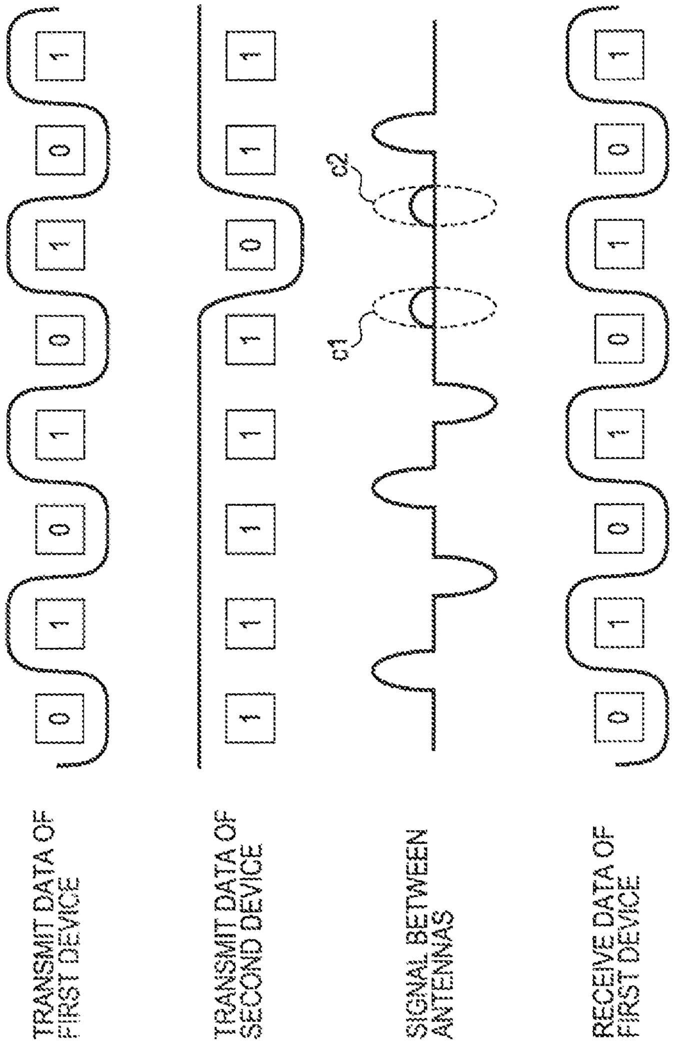
FIG. 30A Related Art
FIG. 30B Related Art
FIG. 30C Related Art
FIG. 30D Related Art
FIGS. 30A to 30D are timing diagrams showing an example of signal state in the example of a communication system according to the related art.

In the example shown in FIG. 26, a square whose orientation is changed is divided in four to form conductive patterns 111*a*" to 111". In this example, the conductive patterns 111*a*" to 111*d*" divided in four each have a square shape, and are respectively connected with feed patterns 113*a*" to 113*d*". A slot 114" provided around the outer periphery of the conductive patterns 111*a*" to 111*d*" also has a square shape.

The foregoing description is directed to the configuration in which the feed patterns are provided on the same surface as the conductive patterns. However, the feed patterns may be provided on a surface different from the conductive pattern placement surface serving as an antenna surface. For example, in the example shown in FIG. 27A, conductive patterns 131*a* to 131*d* obtained by dividing a circle into four equal parts are provided on the front surface of a substrate (coupler) 130. Then, as shown in the cross-section in FIG. 27B, corresponding respective feed patterns 133*a* to 133*d* are provided on the back surface side of the substrate 130. It should be noted that feeding points 132*a* to 132*d* are formed as through-holes extending through the substrate. Also, as shown in the cross-section in FIG. 27B, a GND layer 135 is provided in the inside of the substrate 130.

The foregoing description is directed to the case in which transmit signals are differential signals, a transmit signal corresponding to only one waveform may be transmitted. In this case, the electrode pattern on the side to which the transmit signal is not supplied may be connected to the GND layer at the feeding point.

According to an embodiment of the present invention, short range radio communication can be performed between two couplers placed in close proximity to each other, and two-way radio communication can be performed efficiently in a space-saving manner.

The present application contains subject matter related to that disclosed in Japanese Priority Patent Application JP 2009-193251 filed in the Japan Patent Office on Aug. 24, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A coupler comprising: a first conductive pattern provided on a substrate having an insulating property; a second conductive pattern provided on the substrate and placed in opposition to the first conductive pattern; a third conductive pattern provided on the substrate; a fourth conductive pattern provided on the substrate and placed in opposition to the third conductive pattern; a ground potential portion placed around positions on the substrate where the first conductive pattern, the second conductive pattern, the third conductive pattern, and the fourth conductive pattern are placed; a first resistor connecting between the first conductive pattern and the second conductive pattern placed in opposition to each other; and a second resistor connecting between the third conductive pattern and the fourth conductive pattern placed in opposition to each other, wherein: a transmit signal including each of differential signals of mutually opposite phases is supplied to the first conductive pattern and the second conductive pattern and transmitted; and a receive signal including each of differential signals of mutually opposite phases is obtained by the third conductive pattern and the fourth conductive pattern.

2. The coupler according to claim 1, wherein:

a transmit signal is supplied to the first conductive pattern and transmitted; and a receive signal is obtained by the third conductive pattern.

3. The coupler according to claim 1 wherein: the transmit signal supplied to the first conductive pattern and/or the second conductive pattern is a signal with binary levels; and the receive signal obtained by the third conductive pattern and/or the fourth conductive pattern is detected as a derivative signal if the signal with binary levels transmitted from the other party.

4. The coupler according to claim 2, wherein:

the transmit signal supplied to the first conductive pattern and/or the second conductive pattern is a signal with binary levels; and the receive signal obtained by the third conductive pattern and/or the fourth conductive pattern is detected as a derivative signal of the signal with binary levels transmitted from the other party.

5. The coupler according to claim 1, wherein a surface on which the first conductive pattern, the second conductive pattern, the third conductive pattern, and the fourth conductive pattern are placed, and a surface on which the ground potential portion is placed are different surfaces of the substrate.

6. The coupler according to claim 1, wherein at least one of the first resistor and the second resistor is placed on a surface different from a surface on which the first conductive pattern, the second conductive pattern, the third conductive pattern, and the fourth conductive pattern are placed.

7. A communication system which performs communication by placing a first coupler placed in a first device and a second coupler placed in a second device in close proximity to each other, the first coupler and the second coupler each including: a first conductive pattern provided on a substrate having an insulating property; a second conductive pattern provided on the substrate and placed in opposition to the first conductive pattern; a third conductive pattern provided on the substrate; a fourth conductive pattern provided on the substrate and placed in opposition to the third conductive pattern; a ground potential portion placed around positions on the substrate where the first conductive pattern, the second conductive pattern, the third conductive pattern, and the fourth conductive pattern are placed; a first resistor connecting between the first conductive pattern and the second conductive pattern placed in opposition to each other; and a second resistor connecting between the third conductive pattern and the fourth conductive pattern placed in opposition to each other, wherein: a transmit signal including each of differential signals of mutually opposite phases is supplied to the first conductive pattern and the second conductive pattern and transmitted; and a receive signal including each of differential signals of mutually opposite phases is obtained by the third conductive pattern and the fourth conductive pattern.

8. The communication system according to claim 7, wherein:

the first conductive pattern, the second conductive pattern, the third conductive pattern, and the fourth conductive pattern of the first coupler, and the first conductive pattern, the second conductive pattern, the third conductive pattern, and the fourth conductive pattern of the second coupler are placed in close proximity and in opposition to each other so as to make the respective conductive patterns face each other; and a transmit signal supplied to each of the conductive patterns of the first coupler is received by one of the conductive patterns of the second coupler which is opposed to the corresponding conductive pattern.

9. The communication system according to claim 8, wherein:

a transmit signal including each of differential signals of mutually opposite phases is supplied to the first conductive pattern and the second conductive pattern of the first coupler and transmitted, and a receive signal as each of differential signals is obtained by the first conductive pattern and the second conductive pattern of the second coupler; and a transmit signal including each of differential signals of mutually opposite phases is supplied to the third conductive pattern and the fourth conductive pattern of the second coupler, and a receive signal as each of differential signals is obtained by the third conductive pattern and the fourth conductive pattern of the first coupler.

10. The communication system according to claim 8, wherein the transmit signal is a signal with binary levels, and the receive signal is detected as a derivative signal of the signal with binary levels.

11. The communication system according to claim 9, wherein the transmit signal is a signal with binary levels, and the receive signal is detected as a derivative signal of the signal with binary levels.

* * * * *